(12) United States Patent
Gao et al.

(10) Patent No.: US 11,663,940 B2
(45) Date of Patent: May 30, 2023

(54) DISPLAY ASSEMBLY, DISPLAY DEVICE, AND DRIVING METHOD

(71) Applicant: BOE TECHNOLOGY GROUP CO., LTD., Beijing (CN)

(72) Inventors: Jian Gao, Beijing (CN); Xue Dong, Beijing (CN); Sen Ma, Beijing (CN); Xiaochuan Chen, Beijing (CN); Tao Hong, Beijing (CN); Yanliu Sun, Beijing (CN); Fang Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/765,757

(22) PCT Filed: May 7, 2021

(86) PCT No.: PCT/CN2021/092184
§ 371 (c)(1),
(2) Date: Mar. 31, 2022

(87) PCT Pub. No.: WO2022/028020
PCT Pub. Date: Feb. 10, 2022

(65) Prior Publication Data
US 2022/0366819 A1 Nov. 17, 2022

(30) Foreign Application Priority Data
Aug. 3, 2020 (CN) .......................... 202010768791.8

(51) Int. Cl.
*G09G 3/00* (2006.01)
*G02B 30/27* (2020.01)

(52) U.S. Cl.
CPC ............. *G09G 3/001* (2013.01); *G02B 30/27* (2020.01); *H10K 50/858* (2023.02); *G09G 2320/028* (2013.01); *G09G 2354/00* (2013.01)

(58) Field of Classification Search
CPC ............. G09G 3/001; G09G 2320/028; G09G 2354/00; G02B 30/27; H10K 50/858
See application file for complete search history.

(56) References Cited

U.S. PATENT DOCUMENTS

2012/0062991 A1* 3/2012 Krijn .................... H04N 13/312
359/463
2013/0208357 A1* 8/2013 Saito ....................... G02B 30/27
359/463

(Continued)

FOREIGN PATENT DOCUMENTS

CN 104345459 A 2/2015
CN 105143963 A 12/2015

(Continued)

OTHER PUBLICATIONS

Office action from Chinese Application No. 202010768791.8 dated Oct. 21, 2021.

(Continued)

*Primary Examiner* — Ricardo Osorio
(74) *Attorney, Agent, or Firm* — Calfee, Halter & Griswold LLP

(57) ABSTRACT

The present disclosure relates to a display assembly, a display device and a driving method. The display assembly includes: a display panel provided with a plurality of pixel islands distributed in an array, any one of the pixel islands including sub-pixels continuously arranged along a set direction; and a lens layer arranged on a light exit surface of the display panel and including lenses arranged along the set direction. A lenticular lens pitch is not greater than a size of an opening of each pixel island in the set direction, and along (Continued)

the set direction, a sub-pixel pitch in each of the pixel islands is smaller than a half of the lenticular lens pitch. The lenticular lens pitch is equal to a sum of a size of each lenticular lens in the set direction and a distance between two adjacent ones of the plurality of lenticular lenses.

20 Claims, 20 Drawing Sheets

(56) References Cited

U.S. PATENT DOCUMENTS

| | | | | |
|---|---|---|---|---|
| 2013/0314780 A1* | 11/2013 | Marttila | ................. | G02B 30/27 359/463 |
| 2015/0009560 A1 | 1/2015 | Lun-Wei et al. | | |
| 2018/0321501 A1 | 11/2018 | Muller | | |
| 2020/0064643 A1 | 2/2020 | Allen | | |
| 2020/0301162 A1 | 9/2020 | Ryo et al. | | |

FOREIGN PATENT DOCUMENTS

| | | | | |
|---|---|---|---|---|
| CN | 107257937 A | | 10/2017 | |
| CN | 110459577 A | | 11/2019 | |
| CN | 110824725 A | | 2/2020 | |
| CN | 111175982 A | | 5/2020 | |
| CN | 111223904 A | | 6/2020 | |
| CN | 111766716 A | | 10/2020 | |
| CN | 112868227 A | * | 5/2021 | ............. G02B 30/10 |
| CN | 113767307 A | * | 12/2021 | ........... G02B 3/0037 |
| EP | EP-2490451 A1 | * | 8/2012 | ......... G02B 27/2214 |
| JP | 2015194706 A | | 11/2015 | |
| JP | 2017181787 A | | 10/2017 | |
| KR | 20130000692 A | * | 1/2013 | |
| TW | 201502583 A | | 1/2015 | |
| TW | I471610 B | | 2/2015 | |
| WO | 2012046654 A | | 4/2012 | |
| WO | WO-2019040484 A1 | * | 2/2019 | ......... G02B 27/0075 |
| WO | WO-2020247763 A1 | * | 12/2020 | ........... G02B 3/0068 |

OTHER PUBLICATIONS

Office action from Chinese Application No. 202010768791.8 dated Apr. 13, 2022.
Allowance from Chinese Application No. 202010768791.8 dated Aug. 2, 2022.
International Search Report from PCT/CN2021/092184 dated Aug. 12, 2021.
Written Opinion from PCT/CN2021/092184 dated Aug. 12, 2021.

* cited by examiner

DISPLAY ASSEMBLY, DISPLAY DEVICE, AND DRIVING METHOD

CROSS REFERENCE OF RELATED APPLICATION(S)

This application is a 371 application of PCT Application No. PCT/CN2021/092184, filed May 7, 2021 which claims priority to Chinese patent application No. 202010768791.8, filed on Aug. 3, 2020 and entitled "DISPLAY ASSEMBLY, DISPLAY DEVICE, AND DRIVING METHOD", the entire contents of which are incorporated herein by reference in its entirety.

TECHNICAL FIELD

Embodiments of the present disclosure generally relate to the display technical field, and more particularly, to a display assembly, a display device and a driving method.

BACKGROUND

A glasses-free three-dimensional (3D) display panel is a kind of display system that can use parallax characteristics of human eyes to obtain realistic three-dimensional images with space and depth without any assistance devices (such as 3D glasses, 3D helmets, and so on). Because the glasses-free 3D images have the advantages of real and vivid expression, beautiful and elegant environmental appeal, and strong and shocking visual impact, the application scenarios of glasses-free 3D display panels are becoming more and more extensive.

The glasses-free 3D display panel can use a lenticular lens grating technology to realize the refraction of light emitted by different sub-pixels to the left eye and the right eye respectively, so that the left and right eyes can observe different left and right disparity images respectively. However, in related arts, the 3D angle of view of the glasses-free 3D display panel is small, and a user can only view the 3D effect at a specific position in front of the display panel. In addition, the lenticular lens grating needs to be aligned with pixels of the display panel, which complicates the fabrication process of the glasses-free 3D display panel.

The above information disclosed in this Background section is only for enhancement of understanding of the background of the disclosure and therefore it may contain information that does not form the prior art that is already known to a person of ordinary skill in the art.

SUMMARY

An objective of the present disclosure is to provide a display assembly, a display device and a driving method to increase the 3D angle of view.

In order to achieve the above objective, embodiments of the present disclosure provide the following technical solutions.

According to a first aspect of the present disclosure, there is provided a display assembly, including:

a display panel provided with a plurality of pixel islands distributed in an array, wherein any one of the pixel islands includes a plurality of sub-pixels continuously arranged along a set direction; and a lens layer arranged on a light exit surface of the display panel and including a plurality of lenticular lenses arranged along the set direction;

wherein a lenticular lens pitch is not greater than a size of an opening of each of the pixel islands in the set direction, and along the set direction, a sub-pixel pitch in each of the pixel islands is smaller than a half of the lenticular lens pitch;

wherein the lenticular lens pitch is equal to a sum of a size of each of the lenticular lenses in the set direction and a distance between two adjacent ones of the plurality of lenticular lenses.

According to an example embodiment of the present disclosure, the pixel islands are located at a focal plane of the lenticular lenses.

According to an example embodiment of the present disclosure, the opening of each of the pixel islands is shaped as a parallelogram, and a short side direction of the opening of each of the pixel islands is parallel to an extending direction of each of the lenticular lens.

According to an example embodiment of the present disclosure, a size of the opening of each of the pixel islands in the set direction is equal to 10 to 100 microns.

According to an example embodiment of the present disclosure, a size of each of the lenticular lenses in the set direction is equal to the lenticular lens pitch.

According to an example embodiment of the present disclosure, the lens layer further includes a plurality of light shielding bars arranged along the set direction, and the light shielding bars and the lenticular lenses are alternately arranged.

According to an example embodiment of the present disclosure, light emitting colors of sub-pixels in a same pixel island are the same.

According to an example embodiment of the present disclosure, there are four to twelve sub-pixels continuously arranged along the set direction in any one of the pixel islands.

According to an example embodiment of the present disclosure, a focal length of each of the lenticular lenses is equal to 62 to 82 microns, the lenticular lens pitch is equal to 30 to 40 microns, and the size of the opening of each of the pixel islands in the set direction is equal to 30 to 40 microns.

According to an example embodiment of the present disclosure, a focal length of each of the lenticular lenses is equal to 300 to 400 microns, the lenticular lens pitch is equal to 75 to 100 microns, and the size of the opening of each of the pixel islands in the set direction is equal to 75 to 100 microns.

According to an example embodiment of the present disclosure, the lenticular lens pitch is equal to the size of the opening of each of the pixel islands in the set direction.

According to a second aspect of the present disclosure, there is provided a display device including the above display assembly.

According to a third aspect of the present disclosure, there is provided a driving method for driving a display device, wherein the display device includes the above display assembly;

wherein the driving method includes:

obtaining positions of both eyes;

determining image sub-pixels of the pixel islands according to the positions of both eyes, wherein an image sub-pixel of any one of the pixel islands includes a first sub-pixel for displaying a left-eye image and a second sub-pixel for displaying a right-eye image; and driving first sub-pixels to display left-eye images, and driving second sub-pixels to display right-eye images.

According to an example embodiment of the present disclosure, the lenticular lens pitch is equal to the size of the opening of each of the pixel islands in the set direction;

wherein determining image sub-pixels of the pixel islands according to the positions of both eyes includes:

determining the first sub-pixel and the second sub-pixel of each of the pixel islands according to the positions of both eyes;

wherein determining of the first sub-pixel and the second sub-pixel of any one of the pixel islands includes:

determining from visual sub-regions of the pixel island a visual sub-region where the pupil of the left eye is located as a first visual sub-region;

determining a sub-pixel corresponding to the first visual sub-region as the first sub-pixel of the pixel island;

determining from the visual sub-regions of the pixel island a visual sub-region where the pupil of the right eye is located as a second visual sub-region; and determining a sub-pixel corresponding to the second visual sub-region as the second sub-pixel of the pixel island;

wherein any one of the visual sub-regions of the pixel island is a spatial region projected by one of the sub-pixels of the pixel island through one of the lenticular lenses.

According to an example embodiment of the present disclosure, the lenticular lens pitch is smaller than the size of the opening of each of the pixel islands in the set direction;

wherein determining image sub-pixels of the pixel islands according to the positions of both eyes includes:

determining the first sub-pixel and the second sub-pixel of each of the pixel islands according to the positions of both eyes;

wherein determining of the first sub-pixel and the second sub-pixel of any one of the pixel islands includes:

determining whether any one of the pupil of the left eye and the pupil of the right eye is located in an overlapping region of different visual regions of the pixel island;

if neither the pupil of the left eye nor the pupil of the right eye is located in the overlapping region of the different visual regions of the pixel island, determining from visual sub-regions of the pixel island a visual sub-region where the pupil of the left eye is located as a first visual sub-region; determining a sub-pixel corresponding to the first visual sub-region as the first sub-pixel of the pixel island; determining from the visual sub-regions of the pixel island a visual sub-region where the pupil of the right eye is located as a second visual sub-region; and determining a sub-pixel corresponding to the second visual sub-region as the second sub-pixel of the pixel island;

if the pupil of the left eye is located in the overlapping region of the different visual regions of the pixel island, determining from the visual sub-regions of the pixel island a visual sub-region where the pupil of the right eye is located as a second visual sub-region; determining a sub-pixel corresponding to the second visual sub-region as the second sub-pixel of the pixel island; determining from the visual sub-regions of the pixel island a visual sub-region where the pupil of the left eye is located and which belongs to one of the visual regions as a first candidate visual sub-region; determining from the visual sub-regions of the pixel island a visual sub-region where the pupil of the left eye is located and which belongs to another one of the visual regions as a second candidate visual sub-region; on a connection line connecting the pupil of the left eye and the pupil of the right eye, selecting one of the first candidate visual sub-region and the second candidate visual sub-region which has a larger distance from the second visual sub-region as the first visual sub-region; and determining a sub-pixel corresponding to the first visual sub-region as the first sub-pixel of the pixel island; and if the pupil of the right eye is located in the overlapping region of the different visual regions of the pixel island, determining from the visual sub-regions of the pixel island a visual sub-region where the pupil of the left eye is located as a first visual sub-region; determining a sub-pixel corresponding to the first visual sub-region as the first sub-pixel of the pixel island; determining from the visual sub-regions of the pixel island a visual sub-region where the pupil of the right eye is located and which belongs to one of the visual regions as a third candidate visual sub-region; determining from the visual sub-regions of the pixel island a visual sub-region where the pupil of the right eye is located and which belongs to another one of the visual regions as a fourth candidate visual sub-region; on a connection line connecting the pupil of the left eye and the pupil of the right eye, selecting one of the third candidate visual sub-region and the fourth candidate visual sub-region which has a larger distance from the first visual sub-region as the second visual sub-region; and determining a sub-pixel corresponding to the second visual sub-region as the second sub-pixel of the pixel island;

wherein any one of the visual regions of the pixel island is a spatial region projected by the pixel island through one of the lenticular lenses, and any one of the visual sub-regions of the pixel island is a spatial region projected by one of the sub-pixels of the pixel island through one of the lenticular lenses.

In the display assembly, the display device and the driving method according to embodiments of the present disclosure, by optimizing design of parameters such as the positional relationship between sub-pixels in the pixel islands, the sub-pixel pitch, the opening size of each of the pixel islands and the lenticular lens pitch, the angle of view of the display assembly can be expanded to nearly 180°, and a glasses-free 3D display with a wide angle of view is realized. In addition, when preparing the display assembly, there is no need to align the lenticular lenses with the pixel islands, which can simplify the preparation process of the display assembly and reduce the cost of the display assembly.

BRIEF DESCRIPTION OF THE DRAWINGS

The above and other features and advantages of the present disclosure will become more apparent from the detailed description of example embodiments with reference to the accompanying drawings.

FIG. 13 is a specific schematic diagram of a position close to a sub-pixel in FIG. 12.

FIG. 15 is a specific schematic diagram of a position close to a sub-pixel in FIG. 14.

FIG. 17 is a specific schematic diagram of a position close to a sub-pixel in FIG. 16.

Figure 1:
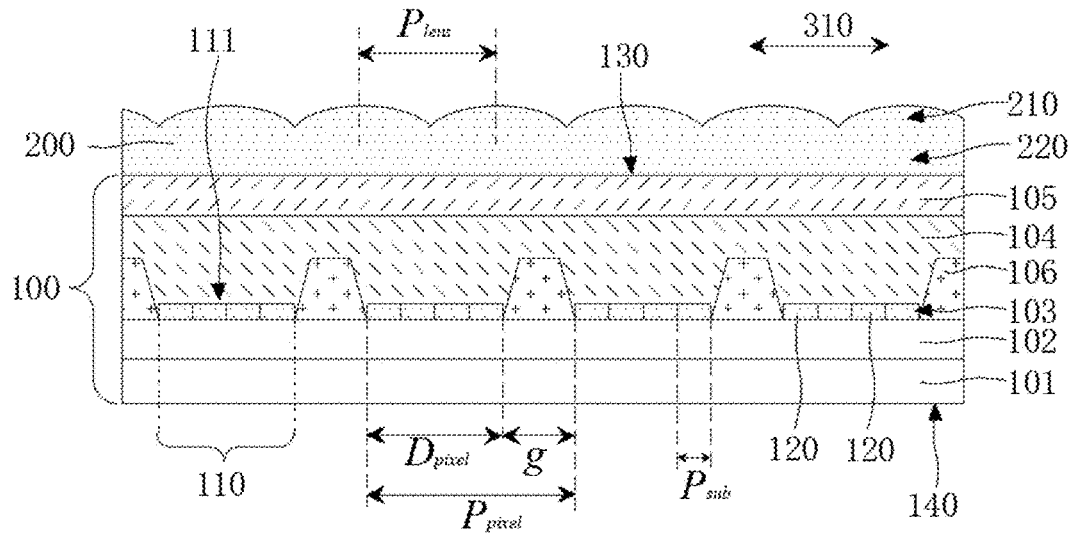
FIG. 1 is a schematic cross-sectional structural diagram of a display assembly according to an embodiment of the present disclosure.

Listing of main components in the figures:
010: non-luminous region; 020: divergent non-visual region; 100: display panel; 101: base substrate; 102: driving circuit layer; 103: pixel layer; 104: encapsulation layer; 105, circular polarizer; 106: pixel definition layer; 110: pixel island; 111: opening of each pixel island; 120: sub-pixel; 130: light exit surface; 140: back surface; 200: lens layer; 210: lenticular lens; 220: matrix layer; 230: shading bar; 310: set direction; 320: first direction; 330: second direction; 410: pupil of left eye; 420: pupil of right eye; A: visual region; $A_{sub}$, visual sub-region; $A_{cross}$: overlapping region.

DETAILED DESCRIPTION

Example embodiments will now be described more fully with reference to the accompanying drawings. Example embodiments, however, can be embodied in various forms and should not be construed as limited to the examples set forth herein; rather, these embodiments are provided so that this disclosure will be thorough and complete, and will fully convey the concept of example embodiments to those skilled in the art. The described features, structures, or characteristics may be combined in any suitable manner in one or more embodiments. In the following description, numerous specific details are provided in order to give a thorough understanding of the embodiments of the present disclosure.

In the figures, the thickness of regions and layers may be exaggerated for clarity. The same reference numerals in the drawings denote the same or similar structures, and thus their detailed descriptions will be omitted.

The described features, structures, or characteristics may be combined in any suitable manner in one or more embodiments. In the following description, numerous specific details are provided in order to give a thorough understanding of the embodiments of the present disclosure. However, one skilled in the art will appreciate that the technical solutions of the present disclosure may be practiced without one or more of the specific details, or other methods, components, materials, etc. may be employed. In other instances, well-known structures, materials, or operations are not shown or described in detail to avoid obscuring the main technical idea of the present disclosure.

The terms "a" or "an" are used to indicate the presence of one or more elements/components/etc., and the term "one" is used to indicate the presence of one element/component/etc.; the terms "including" and "having" are used to indicate an open-ended inclusive meaning and means that additional elements/components/etc. may be present in addition to the listed elements/components/etc. The terms "first" and "second" etc. are used only as indicators and are not intended to limit the number of their objects.

Figure 2:
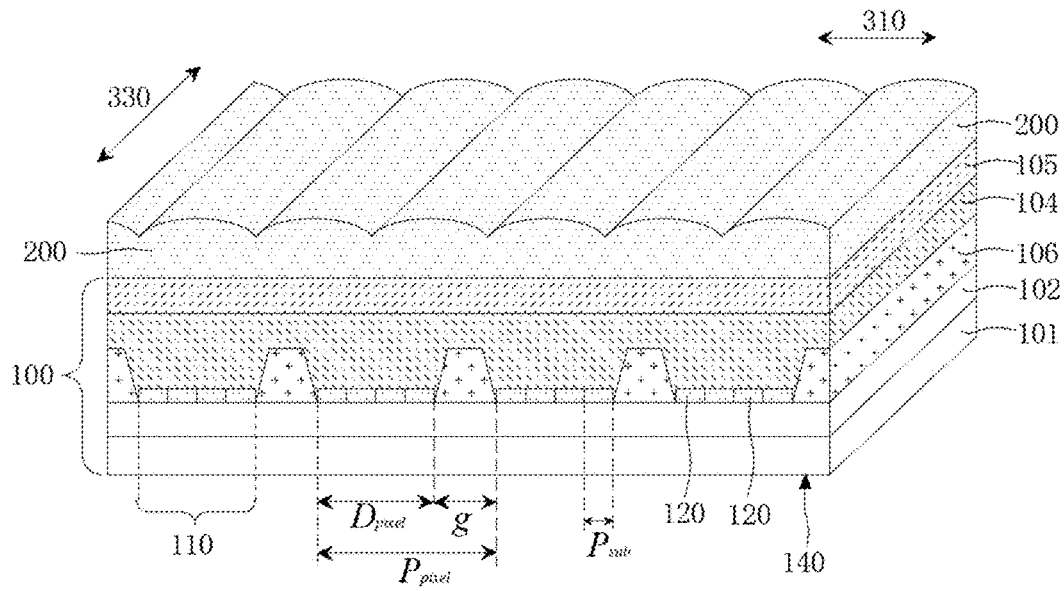
FIG. 2 is a schematic three-dimensional structural diagram of a display assembly according to an embodiment of the present disclosure.

An embodiment of the present disclosure provides a display assembly, which can be applied to a display device, so that the display device can realize glasses-free 3D display. As shown in FIGS. 1 and 2, the display assembly provided by an embodiment of the present disclosure includes a display panel 100 and a lens layer 200. The display panel 100 is provided with a plurality of pixel islands 110 distributed in an array. Any one of the pixel islands 110 includes a plurality of sub-pixels 120 continuously arranged along a set direction 310. The lens layer 200 is disposed on a light exit surface 130 of the display panel 100 and includes a plurality of lenticular lenses 210 arranged along the set direction 310. A pitch $P_{lens}$ of the lenticular lenses 210 is not greater than the size $D_{pixel}$ of an opening 111 of each of the pixel islands in the set direction 310. A pitch $P_{sub}$ of the sub-pixels 120 in each pixel island 110 is smaller than half of the pitch $P_{lens}$ of the lenticular lenses 210. The pitch $P_{lens}$ of the lenticular lenses 210 is equal to the sum of the size of each of the lenticular lenses 210 in the set direction 310 and a distance between two adjacent lenticular lenses 210, that is, the distance between the central axes of two adjacent lenticular lenses 210.

In the display assembly according to the embodiment of the present disclosure, by optimizing design of parameters such as the positional relationship between sub-pixels 120 in the pixel islands 110, the sub-pixel pitch $P_{sub}$ (i.e., the pitch of the sub-pixels 120), the size of the opening 111 of each of the pixel islands and the lenticular lens pitch $P_{lens}$ (i.e., pitch of the lenticular lens 210), the angle of view of the display assembly can be expanded to nearly 180°, and a glasses-free 3D display with a wide angle of view is realized. In addition, when preparing the display assembly, there is no need to align the lenticular lenses 210 with the pixel islands 110, which can simplify the preparation process of the display assembly.

Hereinafter, the structures, principles and effects of the display assembly according to embodiments of the present disclosure will be further explained and described with reference to the accompanying drawings.

As shown in FIG. 1 and FIG. 2, the display assembly according to an embodiment of the present disclosure includes the display panel 100 and the lens layer 200 which are stacked. The display panel 100 includes a light exit surface 130 and a back surface 140 which are opposite to each other. The light emitted by the display panel 100 is emitted from the light exit surface 130. The lens layer 200 is disposed on the light exit surface 130 of the display panel 100, so that light from different sub-pixels 120 can be projected to different regions away from the display panel 100. In this way, a side of the lens layer 200 away from the display panel 100 is a display side of the display assembly. In order to realize glasses-free 3D display, a display device having the display assembly can be driven according to the following driving method: obtaining positions of both eyes; determining, from sub-pixels 120 of the pixel islands, image sub-pixels of the pixel islands 110 according to the positions of both eyes, wherein an image sub-pixel of any one of the pixel islands 110 includes a first sub-pixel for displaying a left-eye image and a second sub-pixel for displaying a right-eye image; and driving first sub-pixels to display left-eye images, and driving second sub-pixels to display right-eye images. In this way, the left eye can see the left eye images displayed by first sub-pixels, and the right eye can see the right eye images displayed by first sub-pixels, so that the viewer can see the 3D images.

The display panel 100 according to embodiments of the present disclosure may be an Organic Light-Emitting Device (OLED) display panel, a Polymer Light-Emitting Device (PLED) display panel, a Micro Light Emitting Diode (Micro LED) display panel, a Mini Light Emitting Diode (Mini LED) display panel, a Quantum Dot (QD) display panel, a Liquid Crystal Display (LCD) panel or other types of display panels 100.

As an example, the display panel 100 may be an OLED display panel, which may include a base substrate 101, a driving circuit layer 102, a pixel layer 103 and an encapsulation layer 104 that are stacked in sequence. The pixel layer 103 includes pixel islands 110 distributed in an array, and any pixel island 110 includes a plurality of sub-pixels 120 continuously arranged along the set direction 310. Any one of the sub-pixels 120 is an organic light emitting diode. The set direction 310 is a direction parallel with a plane where the base substrate 101 is located. The driving circuit layer 102 may be provided with pixel driving circuits connected to the sub-pixels 120 in a one-to-one correspondence. Any one of the pixel driving circuits may be connected to a corresponding sub-pixel 120 and drive the sub-pixel 120 independently. Each pixel island 110 has a light-emitting area, and the light-emitting area is the opening 111 of the pixel island. It can be understood that, in some embodiments, the opening 111 of the pixel island is a set of light-emitting areas of sub-pixels 120 of the pixel island 110.

According to some embodiments, the encapsulation layer 104 may be a thin-film encapsulation layer, which may include an organic material layer and an inorganic material layer which are stacked, so as to avoid external water and oxygen from invading the pixel islands 110 and causing the sub-pixels 120 to fail.

According to some embodiments, the pixel layer 103 may further include a pixel definition layer 106. The pixel definition layer 106 is formed with pixel openings arranged in a one-to-one correspondence with the pixel islands 110. Any pixel opening may expose a corresponding pixel island opening 111. In some embodiments, the pixel definition layer 106 may be used to define a light emitting area of each pixel island 110, that is, the pixel definition layer 106 defines the openings 111 of the pixel islands. In other embodiments of the present disclosure, the pixel definition layer 106 may be used to isolate light from different pixel islands 110 to avoid crosstalk between the pixel islands 110.

According to some embodiments, the display panel 100 may further include a circular polarizer 105. The circular polarizer 105 may be disposed on a side of the encapsulation layer 104 away from the base substrate 101 to reduce the influence of ambient light on the display effect.

Figure 3:
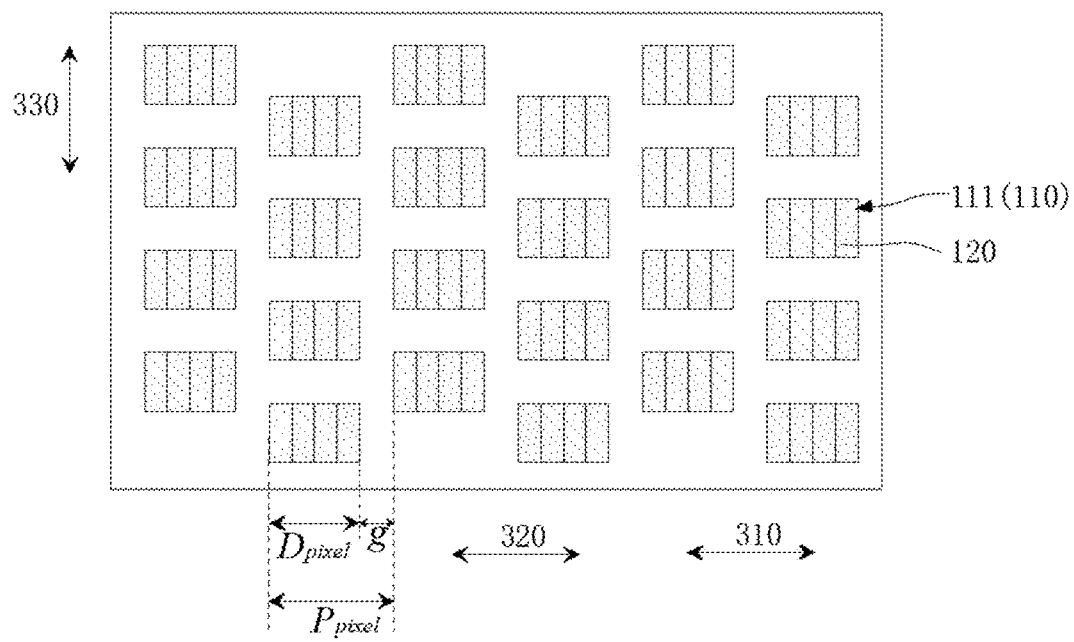
FIG. 3 is a schematic diagram showing distribution of pixel islands according to an embodiment of the present disclosure.
Figure 4:
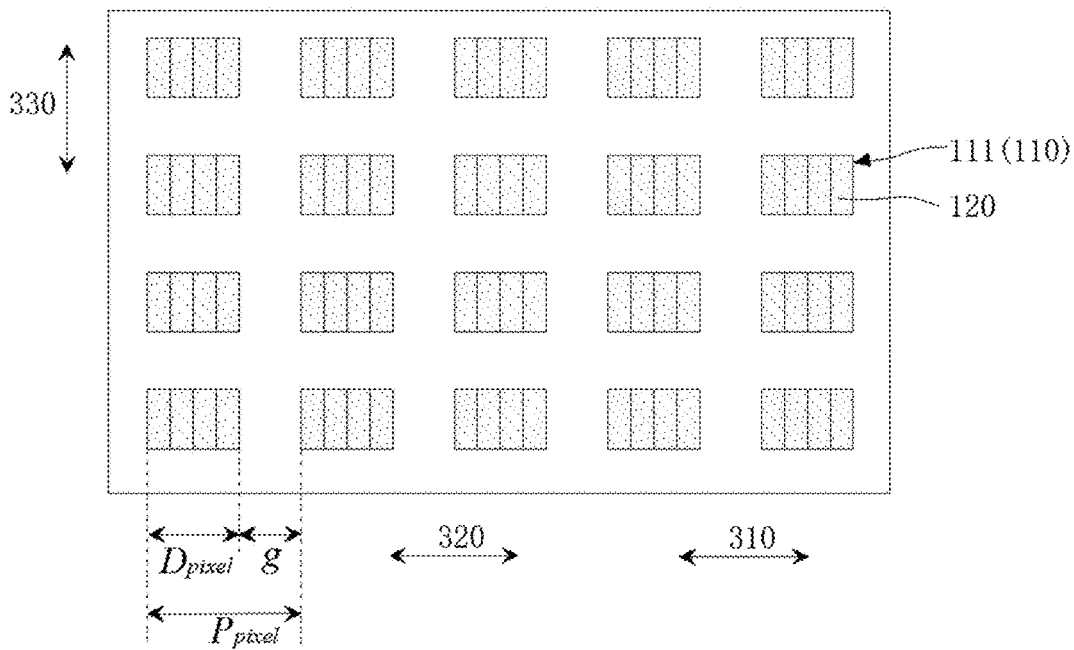
FIG. 4 is a schematic diagram showing distribution of pixel islands according to an embodiment of the present disclosure.

According to some embodiments, as shown in FIGS. 3 and 4, in the display assembly according to embodiments of the present disclosure, the opening 111 of each pixel island may be shaped as a parallelogram. The long side direction of the opening of the pixel island 110 may be a first direction 320, and the short side direction may be a second direction 330. The first direction 320 and the second direction 330 are both directions parallel to the light exit surface 130 of the display panel 100. In other words, the short side direction of the opening 111 of the pixel island may be parallel to the extending direction of the lenticular lenses 210. In some embodiments, the second direction 330 is perpendicular to the set direction 310, and the first direction 320 is the same as the set direction 310. Thus, the opening 111 of the pixel island may be a rectangle. In another embodiment of the present disclosure, the set direction 310 intersects the first direction 320.

Further, in an embodiment of the present disclosure, the first direction 320 is the same as a row direction of the display panel 100, and the second direction 330 is the same as a column direction of the display panel 100. The row direction of the display panel 100 may be an extending direction of scan lines of the display panel 100, and the column direction of the display panel 100 may be an extending direction of data lines of the display panel 100.

Further, in an embodiment of the present disclosure, the pixel islands 110 may be arranged in multiple columns, and any pixel island column includes a plurality of pixel islands 110 arranged along the second direction 330. In this way, the crosstalk between the left-eye view and the right-eye view can be reduced, and the glasses-free 3D display effect can be improved. In addition, this can also facilitate the simultaneous determination of the image sub-pixels of pixel islands in the same pixel island column, which simplifies the driving method of the display assembly.

Further, the pixel islands 110 may also be arranged in multiple rows, and any pixel island row includes a plurality of pixel islands 110 arranged along the first direction 320.

Exemplarily, in another embodiment of the present disclosure, as shown in FIG. 3, the pixel islands 110 are arranged as a plurality of pixel island rows and a plurality of pixel island columns. Any one pixel island column includes a plurality of pixel islands 110 arranged along the second direction 330, and any one pixel island row includes a plurality of pixel islands 110 arranged along the first direction 320. Two adjacent pixel islands 110 in the same pixel island row are respectively located in two pixel island rows separated by one pixel island row, and two adjacent pixel islands 110 in the same pixel island row are respectively located in two pixel island columns separated by one pixel island column.

For another example, in an embodiment of the present disclosure, as shown in FIG. 4, the pixel islands 110 are arranged as a plurality of pixel island rows and a plurality of pixel island columns. Any one pixel island column includes a plurality of pixel islands 110 arranged alone the direction 330, and any one pixel island row includes a plurality of pixel islands 110 arranged along the first direction 320. Two adjacent pixel islands 110 in the same pixel island column are located in two adjacent pixel island rows.

According to some embodiments, the light emitting colors of sub-pixels 120 within the same pixel island 110 are the same. For example, sub-pixels 120 in the same pixel island 110 all emits red light, or all emits green light, or all emits blue light.

According to some embodiments, pixel islands 110 of the display panel 100 include red pixel islands 110 for emitting red light, green pixel islands 110 for emitting green light, and blue pixel islands 110 for emitting blue light. Sub-pixels 120 in each red pixel island 110 all emit red light; sub-pixels 120 in each green pixel island 110 all emit green light; and sub-pixels 120 in each blue pixel island 110 all emits blue light.

Figure 6:
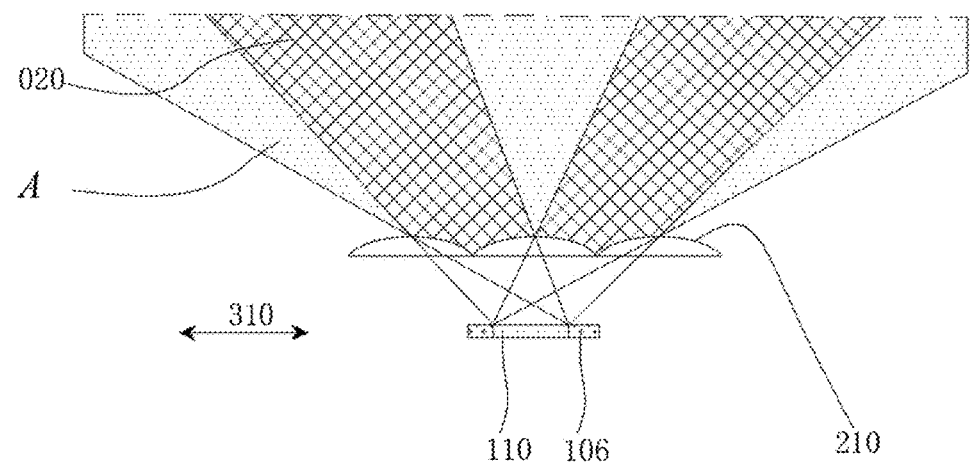
FIG. 6 is a schematic diagram showing distribution of light projected by pixel islands through lenticular lenses when a lenticular lens pitch is greater than the size of an opening of each of the pixel islands in a set direction.
Figure 7:
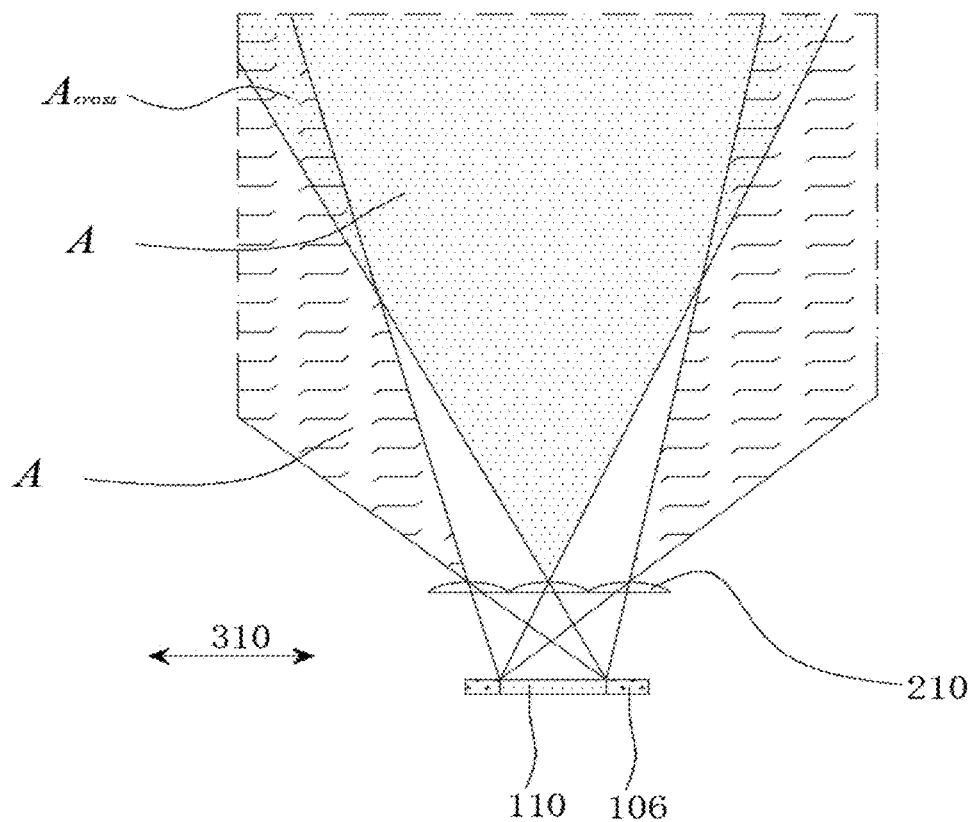
FIG. 7 is a schematic diagram showing distribution of light projected by one pixel island through lenticular lenses in a display assembly according to an embodiment of the present disclosure.
Figure 8:
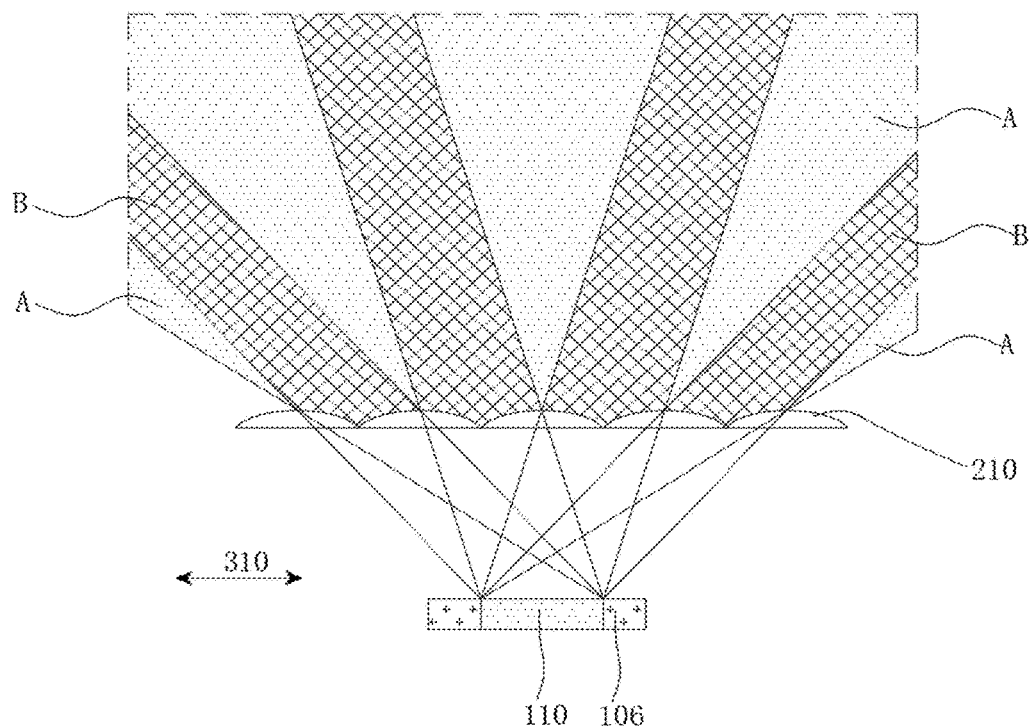
FIG. 8 is a schematic diagram showing distribution of light projected by one pixel island through lenticular lenses in a display assembly according to an embodiment of the present disclosure.

In the display assembly according to embodiments of the present disclosure, referring to FIG. 6 to FIG. 8, any pixel island 110 can project a corresponding visual region A on the display side through any one of the lenticular lenses 210. The visual region A may be a fan-shaped spatial region on the display side of the display assembly. In a cross-section perpendicular to the light exit surface 130 of the display panel 100 and parallel to the set direction 310, the cross-section of the visual region A is a radial area formed by two sides. One pixel island 110 corresponds to a plurality of visual regions A, and one visual region A corresponds to one pixel island 110 and one lenticular lens 210 at the same time. When a pixel island 110 emits light, the light emitted by the pixel island 110 can go to arrive at corresponding visual regions A through lenticular lenses 210, and does not go outside of corresponding visual regions A. In other words, the region on the display side irradiated by the light which is emitted by a pixel island 110 and passes through a lenticular lens 210 is a visual region A corresponding to the pixel island 110 and the lenticular lens 210. In the display assembly according to embodiments of the present disclosure, each visual region A corresponding to a pixel island 110 is a continuous region, and each visual region A corresponds to an angle of view. The angles of view of visual regions A of the pixel islands 110 can be spliced with each other to achieve an overall angle of view close to or equal to 180° on the display side. In other words, the pixel islands 110 can be seen at any angular position on the light exit side.

Figure 11:
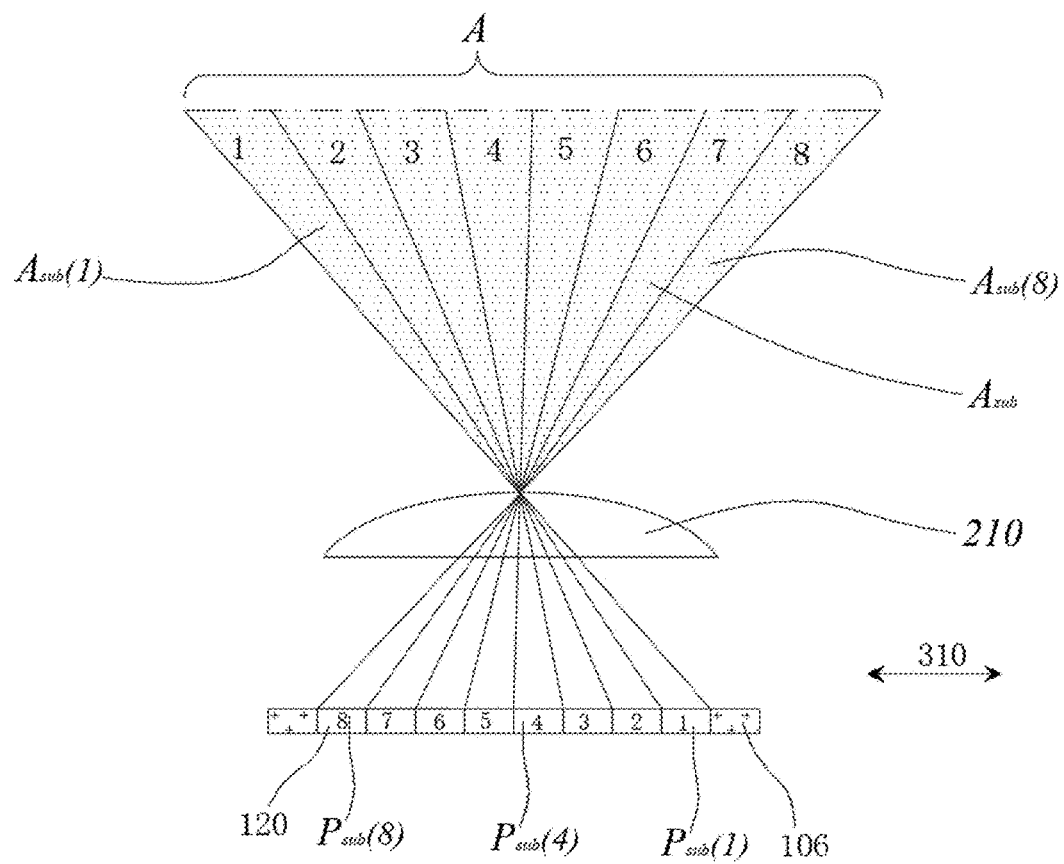
FIG. 11 is a schematic diagram showing distribution of light projected by sub-pixels of one pixel island through one lenticular lens in a display assembly according to an embodiment of the present disclosure.

As shown in FIG. 11, a pixel island 110 includes a plurality of sub-pixels 120 arranged along the set direction 310, and accordingly, any visual region A corresponding to the pixel island 110 includes a plurality of visual sub-regions $A_{sub}$ which correspond to sub-pixels 120 of the pixel island 110 one to one. Any one of the visual sub-regions $A_{sub}$ of the pixel island 110 is a spatial region projected by a sub-pixel 120 of the pixel island 110 through a lenticular lens 210. The visual sub-region $A_{sub}$ may be a fan-shaped region on the display side of the display assembly. In a cross-section perpendicular to the light exit surface 130 of the display panel 100 and parallel to the set direction 310, the cross section of the visual sub-region $A_{sub}$ is a radial area formed by two sides. One sub-pixel 120 corresponds to a plurality of visual sub-regions $A_{sub}$, and one visual sub-region $A_{sub}$ simultaneously corresponds to one sub-pixel 120 and one lenticular lens 210. When a sub-pixel 120 of the pixel island 110 emits light, light from the sub-pixel 120 can be irradiated to its visual sub-regions $A_{sub}$ through the lenticular lenses 210, but not to other regions. In other words, the region on the display side irradiated by the light which is emitted by a sub-pixel 120 and passes through a lenticular lens 210 is a visual sub-region $A_{sub}$ corresponding to the sub-pixel 120 and the lenticular lens 210. Referring to FIG. 11, FIG. 11 exemplarily provides a case where one pixel island 110 includes 8 sub-pixels 120, the x-th sub-pixel is the sub-pixel $P_{sub}(x)$, and x is a positive integer from 1 to 8. A corresponding visual region A is projected by the pixel island 120 through a lenticular lens 120 shown in the figure, and a corresponding visual sub-region $A_{sub}(x)$ is projected by any sub-pixel $P_{sub}(x)$ through the lenticular lens 120.

Figure 5:
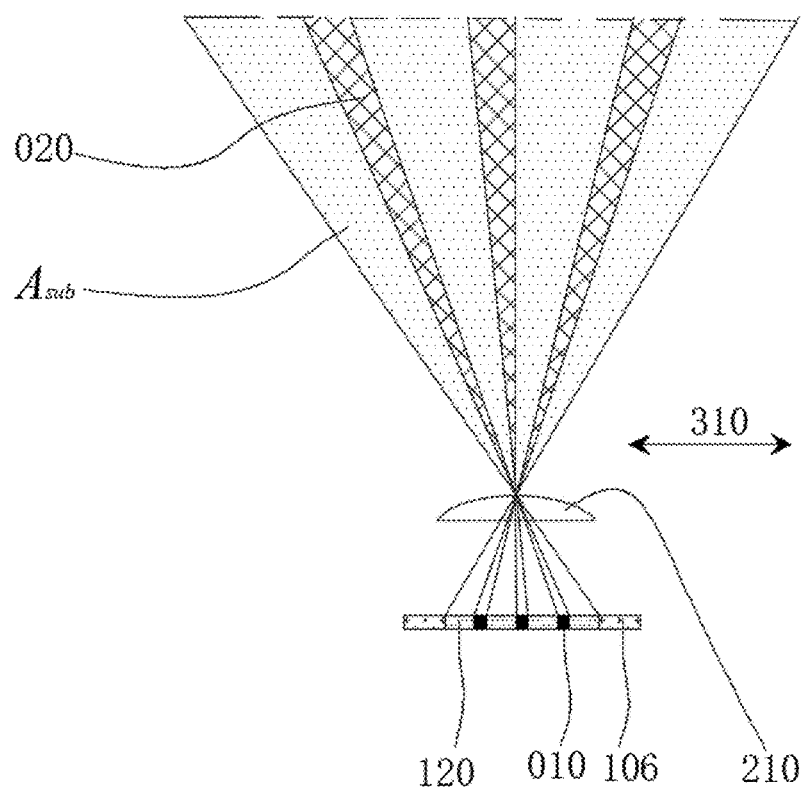
FIG. 5 is a schematic diagram showing distribution of light projected by pixel islands through lenticular lenses when a gap is provided between sub-pixels.

Referring to FIG. 11, in the display assembly according to embodiments of the present disclosure, sub-pixels 120 in the pixel island 110 are continuously arranged along the set direction 310. In other words, in the pixel island 110, the distance between two adjacent sub-pixels 120 along the set direction 310 is zero; along the set direction 310, the size of the each sub-pixel 120 is equal to the pitch $P_{sub}$ of the sub-pixels 120. Referring to FIG. 5, when a non-luminous area 010 exists between two adjacent sub-pixels 120, the non-luminous area 010 forms a divergent non-visual region 020 on the display side through the lens layer 200. The width of the divergent non-visual region 020 increases in a direction away from the display assembly. The width of the divergent non-visual region 020 refers to the size of the divergent non-visual region 020 in the set direction 310. It can be understood that since the width of the divergent non-visual region 020 may increase in a direction away from the display assembly, its width may exceed the width of the eye at a normal viewing distance. When the pupil of the human eye is located in the divergent non-visual region 020, no sub-pixel 120 in the pixel island 110 can be seen, which makes the display assembly unable to achieve a glasses-free 3D display effect close to 180° on the display side. However, in the display assembly according to embodiments of the present disclosure, the sub-pixels 120 in the pixel island 110 are arranged continuously, which can avoid the non-luminous area 010 between two adjacent sub-pixels 120, and prevent the non-luminous area 010 from forming the divergent non-visual region 020 on the display side. In a cross-section perpendicular to the light exit surface 130 of the display panel 100 and parallel to the set direction 310, the width of the divergent non-visual region 020 increases as the distance from the display assembly increases.

According to some embodiments, within the same pixel island 110, the number of sub-pixels 120 arranged along the set direction 310 is 4 to 12. In this way, there can be enough sub-pixels 120 to display the left-eye images and the right-eye images respectively while avoiding too many sub-pixels 120 to increase the cost of display assembly, and accordingly the pixel density of the display panel 100 can be reduced.

In the display assembly according to embodiments of the present disclosure, as shown in FIG. 1, the lens layer 200 may include a matrix layer 220 and lenticular lenses 210 disposed on a side of the matrix layer 220 away from the display panel 100. Preferably, the material of the matrix layer 220 is the same as the material of the lenticular lenses 210, and the matrix layer 220 and the lenticular lenses 210 may be formed as a one-piece structure.

According to some embodiments, the pixel islands 110 are located at a focal plane of the lenticular lenses 210. In this way, the crosstalk between the left-eye images seen by the left eye and the right-eye images seen by the right eye can be reduced, thereby improving the effect of 3D display. In addition, arranging the pixel islands 110 at a focal plane of the lenticular lenses 210 can also facilitate determination of a farthest viewing limit and a nearest viewing limit of the display assembly, and the determination of the first sub-pixels for displaying the left eye images and the second sub-pixels for displaying the right eye images, which helps reduce the complexity of the driving method of the display device to which the display assembly is applied.

In embodiments of the present disclosure, the focal plane of the lenticular lenses is a plane where the focal points of the same side of the lenticular lenses are located, that is, a plane passing through the focal points of the lenticular lenses and perpendicular to the main optical axises of the lenticular lenses.

In the display assembly according to embodiments of the present disclosure, referring to FIG. 1, along the set direction 310, the $P_{lens}$ of the lenticular lenses 210 is not greater than the size $D_{pixel}$ of the opening 111 of each of the pixel islands. Along the set direction 310, the size $D_{pixel}$ of the opening 111 of each of the pixel islands is equal to the pitch $P_{pixel}$ of the pixel islands minus the width g between two adjacent pixel islands 110 in the pixel definition layer 106. In some embodiments of the present disclosure, the pitch $P_{lens}$ of the lenticular lenses 210 is equal to the sum of the size of each of the lenticular lenses 210 in the set direction 310 and the distance between two adjacent lenticular lenses 210, that is, it may be equal to the distance in the set direction 310 between main optical axises of two adjacent lenticular lenses 210. Referring to FIG. 6, along the set direction 310, if the pitch $P_{lens}$ of the lenticular lenses 210 is greater than the size $D_{pixel}$ of the opening 111 of the pixel island in the set direction 310, then a divergent non-visual region 020 is formed between two adjacent boundaries of two adjacent visual regions A corresponding to the pixel island 110. When the pupil is in the divergent non-visual region 020, the eye cannot see any of the pixel islands 110. Since the pitch $P_{lens}$ the lenticular lenses 210 in embodiments of the present of disclosure is not greater than the size $D_{pixel}$ of the opening 111 of each pixel island in the set direction 310, it can be ensured that no divergent non-visual region 020 is formed between the respective visual regions A of the pixel island 110, so as to avoid the situation that the eyes cannot see the pixel island 110 in the divergent non-visual region 020 (which may affect the glasses-free 3D display effect). Correspondingly, it can be ensured that the angles of view of the visual regions A of the pixel island 110 can be spliced with each other, and the pixel island 110 can be seen from any angle on the light-emitting side.

Figure 9:
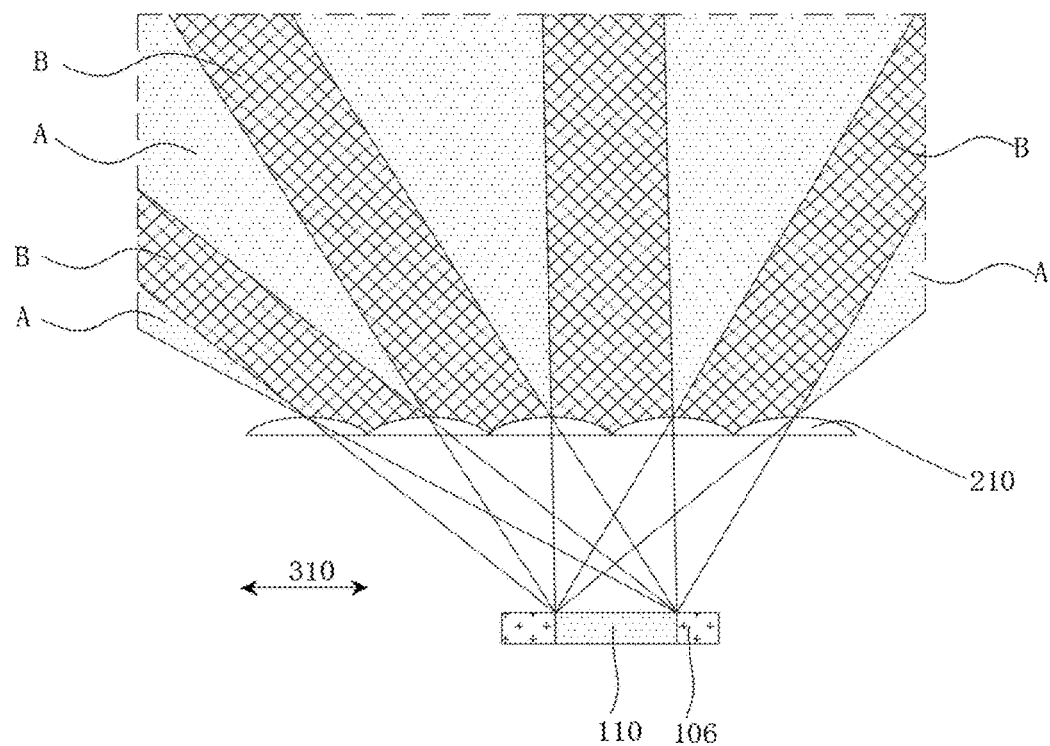
FIG. 9 is a schematic diagram showing distribution of light projected by one pixel island through lenticular lenses in a display assembly according to an embodiment of the present disclosure; wherein, the position of the pixel island in FIG. 9 is shifted by a half of the lenticular lens pitch in the set direction relative to FIG. 8.
Figure 10:
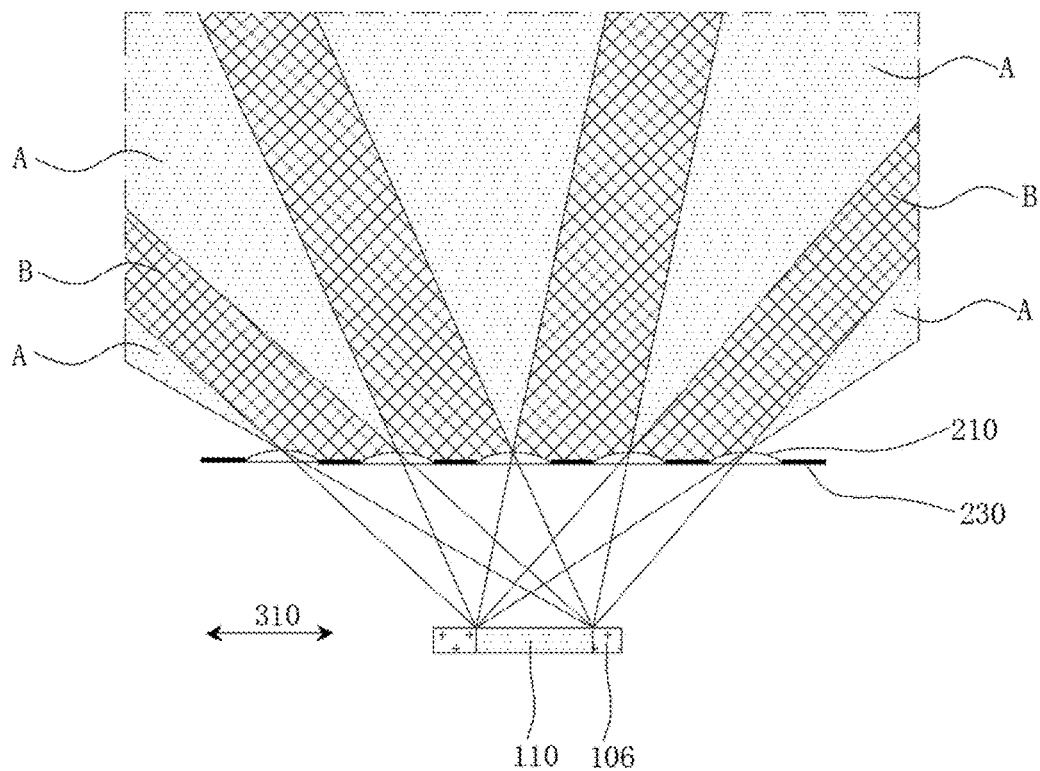
FIG. 10 is a schematic diagram showing distribution of light projected by one pixel island through lenticular lenses in a display assembly according to an embodiment of the present disclosure.

In an embodiment of the present disclosure, along the set direction 310, the pitch $P_{lens}$ of the lenticular lenses 210 is equal to the size $D_{pixel}$ of the opening 111 of the pixel island in the set direction 310. Referring to FIG. 8 to FIG. 10, two adjacent boundaries of two adjacent visual regions A corresponding to the pixel island 110 are parallel to each other. Therefore, the angles of view corresponding to the two adjacent visual regions A corresponding to the pixel island 110 can be continuous, and accordingly the angles of view corresponding to visual regions A corresponding to the pixel island 110 can successively form a total angle of view of 180°. Correspondingly, a strip-shaped non-visual region B is formed between two adjacent visual regions A corresponding to the pixel island 110, and the size of the strip-shaped non-visual region B in the set direction 310 is equal to the size $D_{pixel}$ of the opening 111 of the pixel island in the set direction 310. The strip-shaped non-visual region B is presented as a strip-shaped area, and in the cross-section perpendicular to the light exit surface 130 of the display panel 100 and parallel to the set direction 310, the cross-section of the strip-shaped non-visual region B is an area formed by two parallel sides and located on the display side. Since the opening 111 of the pixel island is very small compared to the size of the pupil and is at retinal level, the existence of the strip-shaped non-visual region B will not make any pixel island 110 completely invisible to the eyes, and thus the visual regions A of the pixel island 110 can be equivalently considered as being in a tightly connected state on the display side. In other words, the strip-shaped non-visual region B does not affect the normal display of the display assembly.

In FIG. 8 and FIG. 9, the alignment positions of the lenticular lenses 210 and the pixel islands 110 are different, but both the arrangements in FIG. 8 and FIG. 9 can make visual regions A of the pixel island 110 equal to the closely connected state on the display side. Therefore, in the display assembly according to embodiments of the present disclosure, no matter whether the lenticular lenses 210 and the pixel islands 110 are aligned or not, the total angle of view of the display assembly remains unchanged. When manufacturing the display assembly, the lenticular lenses 210 and the pixel islands 110 do not need to be aligned, which can simplify the manufacturing process of the display assembly.

According to some embodiments, the size of each pixel island 110 in the set direction 310 is equal to 10 to 100 microns. In this way, it can be avoided that the size of each pixel island 110 in the set direction 310 is too large and the width of the strip-shaped non-visual region B is too large, and the size of the pixel island 110 in the set direction 310 can be prevented from being too small which may lead to the difficulties in preparation of pixels.

For the display assembly of this embodiment, when 3D display is required, the image sub-pixels of any pixel island 110 can be determined according to the following method. From visual sub-regions $A_{sub}$ of the pixel island 110, a visual sub-region $A_{sub}$ where the pupil 410 of the left eye is located is determined as a first visual sub-region $A_{sub}$. A sub-pixel 120 corresponding to the first visual sub-region $A_{sub}$ is determined as a first sub-pixel of the pixel island 110. From visual sub-regions $A_{sub}$ of the pixel island 110, a visual sub-region $A_{sub}$ where the pupil 420 of the right eye is located is determined as a second visual sub-region $A_{sub}$. A sub-pixel 120 corresponding to the second visual sub-region $A_{sub}$ is determined as a second sub-pixel of the pixel island 110.

In this embodiment, the corresponding visual regions A of one pixel island 110 do not overlap, and thus in the 3D visual space, the pupil of one eye will not see a same sub-pixel 120 of the island 110 pixels through two different lenticular lenses 210. Based on this, when 2D display is required, sub-pixels 120 can be made to display 2D pictures, so that the viewer can see the 2D pictures, and the defect of display brightness fluctuations in the set direction 310 will not occur. In other words, the display assembly of this embodiment can also realize 2D display with uniform brightness by driving sub-pixels 120 at the same time to display 2D pictures.

In another embodiment of the present disclosure, along the set direction 310, the pitch $P_{lens}$ of the lenticular lenses 210 is smaller than the size $D_{pixel}$ of the opening 111 of each pixel island in the set direction 310, and then as shown in FIG. 7, two adjacent boundaries of two adjacent visual regions A corresponding to the pixel island 110 intersect. That is, an overlapping region $A_{cross}$ exists between two adjacent visual regions A, and the overlapping region $A_{cross}$ corresponds to one pixel island 110 and two lenticular lenses 210 at the same time. Correspondingly, the angles of view corresponding to the two adjacent visual regions A corresponding to the pixel island 110 partially overlap, so that the angles of view corresponding to the respective visual regions A corresponding to the pixel island 110 can be sequentially overlapped to form a total angle of view of 180° to realize 3D display with wide angle of view.

In an embodiment of the present disclosure, along the set direction 310, the pitch $P_{lens}$ of the lenticular lenses 210 is not smaller than half of the size $D_{pixel}$ of the opening 111 of each pixel island in the set direction 310, and not greater than the size $D_{pixel}$ of the opening 111 of the pixel island in the set direction 310. In this way, an overlapping region $A_{cross}$ is formed between two adjacent visual regions A of the pixel island 110, and an overlapping region $A_{cross}$ is not formed between two non-adjacent visual regions A. In this way, on the one hand, the size of each lenticular lens 210 in the set direction 310 can be increased to improve the manufacturing convenience of the lenticular lenses 210. On the other hand, it is convenient to determine sub-pixels 120 in the pixel island 110 as image sub-pixels corresponding to the eyes according to eye positions. In addition, this embodiment can improve the 3D visual space of the display assembly. The image sub-pixels corresponding to the eyes include at least one first sub-pixel corresponding to the left eye and used for displaying the left-eye images and at least one second sub-pixel corresponding to the right eye and used for displaying the right-eye images, and the number of the at least one first sub-pixel is one or two, and the number of the at least one second sub-pixel is one or two.

For the display assembly of this embodiment, the image sub-pixels 120 of any pixel island 110 can be determined according to the following method:

If the pupil of one eye is not located in the overlapping region $A_{cross}$ of the two visual regions A, a sub-pixel 120 corresponding to a visual sub-region $A_{sub}$ where the pupil of the eye is located is the image sub-pixel 120 corresponding to the eye. For example, if the pupil of the left eye is not located in the overlapping region $A_{cross}$ of the two visual regions A, a sub-pixel 120 corresponding to a visual sub-region $A_{sub}$ where the pupil of the left eye is located is the first sub-pixel. For another example, if the pupil of the right eye is not located in the overlapping region $A_{cross}$ of the two visual regions A, a sub-pixel 120 corresponding to a visual sub-region $A_{sub}$ where the pupil of the right eye is located is the second sub-pixel.

If the pupil of one eye is located in the overlapping region $A_{cross}$ of the visual regions A corresponding to two adjacent lenticular lenses 210, a first candidate visual sub-region $A_{sub}$ and a second candidate visual sub-region $A_{sub}$ corresponding to the pupil of the eye are determined respectively. The first candidate visual sub-region $A_{sub}$ is a visual sub-region $A_{sub}$ where the pupil of the eye is located and which corresponds to one of the lenticular lenses 210, that is, the first candidate visual sub-region $A_{sub}$ belongs to one of the two overlapping visual regions A. The second candidate visual sub-region $A_{sub}$ is a visual sub-region $A_{sub}$ where the pupil of the eye is located and which corresponds to another lenticular lens 210, that is, the second candidate visual sub-region $A_{sub}$ belongs to the other visual region A of the two overlapping visual regions A. In this case, the pupil of the other eye must not be in the overlapping region $A_{cross}$, otherwise the eye will exceed the farthest viewing limit of the display assembly. A visual sub-region $A_{sub}$ where the pupil of the other eye is located is determined as an anchor visual sub-region $A_{sub}$. On the connection line connecting the pupils of the two eyes, a candidate visual sub-region $A_{sub}$ that is farther from the anchor visual sub-region $A_{sub}$ is selected from the first candidate visual sub-region $A_{sub}$ and the second candidate visual sub-region $A_{sub}$ as a target visual sub-region $A_{sub}$ corresponding to the eye, and the sub-pixel 120 corresponding to the target visual sub-region $A_{sub}$ is determined as the image sub-pixel 120 of the eye.

According to some embodiments, in the display assembly according to embodiments of the present disclosure, the size of each lenticular lens 210 in the set direction 310 is equal to the pitch $P_{lens}$ of the lenticular lenses 210. That is, referring to FIG. 1, two adjacent lenticular lenses 210 are connected to each other, and the filling rate of the lenticular lenses 210 is 100%. In this way, not only the width of each lenticular lens 210 in the set direction 310 can be increased to facilitate the preparation of the lenticular lenses 210, but also the light shielding bars located between the lenticular lenses 210 in the lens layer can be avoided, and thus the display assembly can have greater light output efficiency and display brightness.

According to some other embodiments of the present disclosure, the lens layer 200 may further include a plurality of light shielding bars 230 arranged along the set direction 310. The light shielding bars 230 and the lenticular lenses 210 are alternately arranged. In other words, there is a gap between two adjacent lenticular lenses 210, and a light shielding bar 230 for shielding light is disposed in the gap, so as to avoid stray light emitted from the gap which may affect the display effect.

Figure 12:
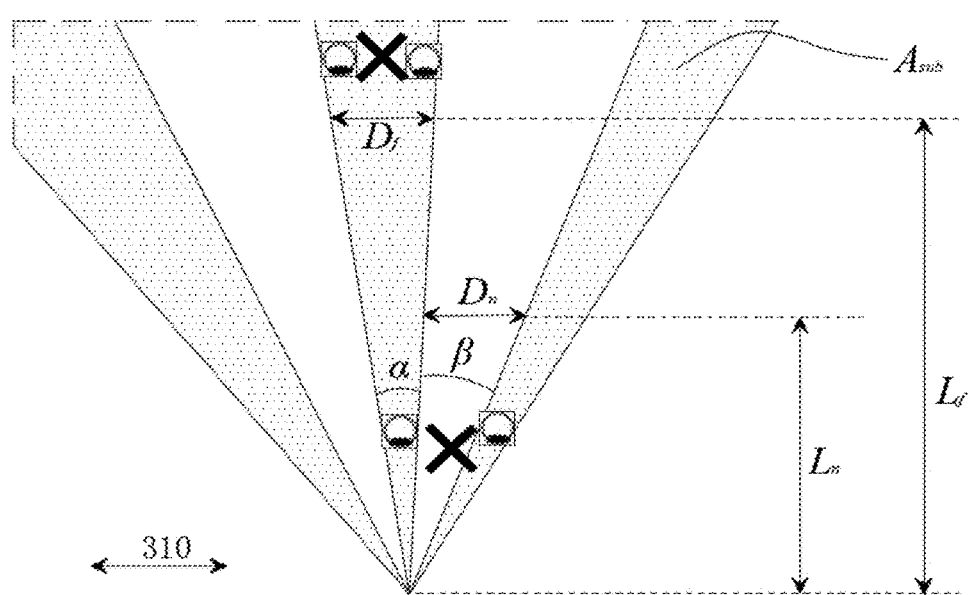
FIG. 12 is a schematic diagram showing basic conditions for realizing 3D display in a display assembly according to an embodiment of the present disclosure.

In the display assembly according to embodiments of the present disclosure, in order to realize 3D display, it is needed for both eyes to be able to view different sub-pixels 120 of a same pixel island 110. Based on this, the 3D visible space of the display assembly is formed, and the 3D visible space is determined by a nearest viewing limit (referred to as the nearest limit) and a farthest viewing limit (referred to as the farthest limit). FIG. 12 illustrates visual sub-regions $A_{sub}$ of one sub-pixel 120 corresponding to three adjacent lenticular lenses 210. When the viewing distance is less than the nearest limit $L_n$, both eyes will see the same sub-pixel 120 which perform projections by different lenticular lenses, and 3D display cannot be realized. When the viewing distance is greater than the farthest limit $L_f$, both eyes will see the same sub-pixel 120 which performs projection by the same lenticular lens 210, and 3D display cannot be realized. Therefore, it can be seen from the geometric relationship that the width $D_n$ of boundaries of adjacent visual sub-regions $A_{sub}$ in FIG. 12 at the nearest limit is equal to the width $D_p$ of one pupil distance of the human eyes, that is, $D_n=D_p$. Similarly, the width $D_f$ of boundaries of the same visual region $A_{sub}$ at the farthest limit is equal to the width $D_p$ of one pupil distance of the human eyes, that is, $D_f=D_p$.

Figure 13:
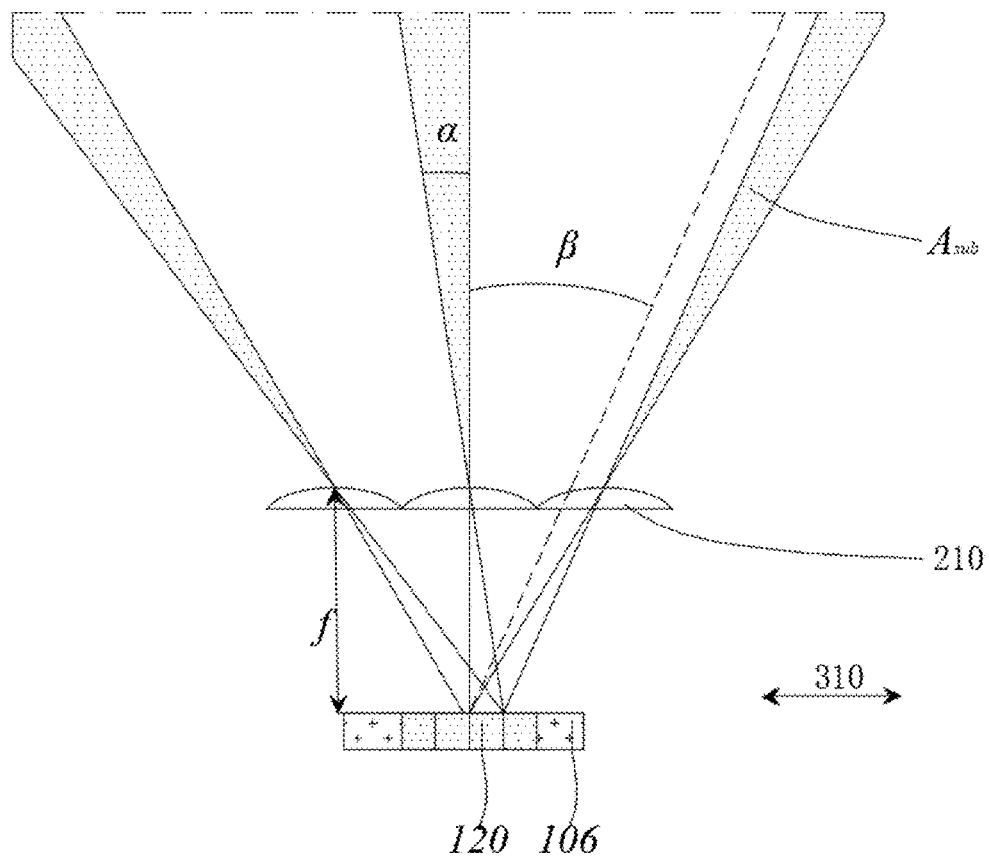
FIG. 13 is a schematic diagram showing basic conditions for realizing 3D display in a display assembly according to an embodiment of the present disclosure.

It can be seen from FIG. 12 that in order to make the 3D visible space exist, it is necessary to ensure that the farthest limit is greater than the nearest limit, and thus $\alpha<\beta$ is required, where a is an angle of light which is cast by the sub-pixel 120 and passes through the lenticular lens 210, that is, the angle formed by the boundaries of the visual sub-region $A_{sub}$ in FIG. 12; $\beta$ is an included angle formed by light which emitted from two ends of the sub-pixel 120 and pass through two adjacent lenticular lens 210 respectively, that is, the included angle formed by adjacent boundaries of two adjacent visual sub-regions $A_{sub}$ corresponding to the same sub-pixel 120 in FIG. 12. Referring to FIG. 13, the included angle is also equivalent to the included angle formed by translating one of the boundaries by one sub-pixel pitch $P_{sub}$ of the sub-pixel 120, and the dotted line in FIG. 13 is the translated boundary. It can be seen from the geometric relationship that in order to ensure $\alpha<\beta$, it is necessary to have $P_{lens}-P_{sub}>P_{sub}$, namely:

$$P_{sub} < \frac{P_{lens}}{2}. \tag{1}$$

In the display assembly according to embodiments of the present disclosure, along the set direction 310, the arrangement pitch $P_{sub}$ of the sub-pixels 120 is less than half of the arrangement pitch $P_{lens}$ of the lenticular lenses 210. Therefore, the display assembly according to embodiments of the present disclosure has a 3D visual space and can realize 3D display.

Exemplarily, in combination with the actual refraction of the film layers and the rotation of the head and the human eyes with the angles of view, the expressions of the nearest limit and the farthest limit are deduced as follows.

Figure 14:
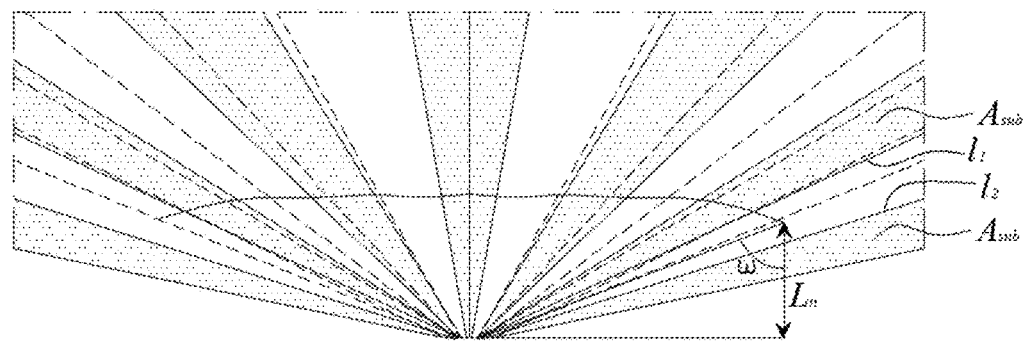
FIG. 14 is a schematic diagram of a proximal distribution of one sub-pixel in a display assembly according to an embodiment of the present disclosure.

The placement height of the lenticular lenses 210 behind the equivalent air layer relative to the pixel islands 110 has been illustrated in FIG. 13. Because the pixel islands 110 are located on the focal plane of the lenticular lenses 210, the placement height behind the equivalent air layer is the focal length f. The purpose of this illustration is to simplify the optical path, because the equivalent light can directly pass through the lenticular lenses 210 without deflection, but such an equivalent optical path is only suitable for light with a small angle. In order to locate the pixel islands 110 on the focal plane of the lenticular lenses 210, the distance between the vertex of each lenticular lens 210 away from the display panel 100 and the pixel island 110 needs to be nf, where n is the refractive index of each lenticular lens 210 and f is the focal length of each lenticular lens 210. In FIG. 14 and FIG.

16, the solid lines are the actual light paths, and the dotted lines are the equivalent light paths through the equivalent air layer. By comparison, it can be seen that at a small angle of view, the actual light paths and the equivalent light paths basically coincide; at a large angle of view, there is a big difference between the actual light paths and the equivalent light paths. Therefore, in this example, light paths with the large angle of view are analyzed in terms of the refraction of the actual film layers.

Figure 15:
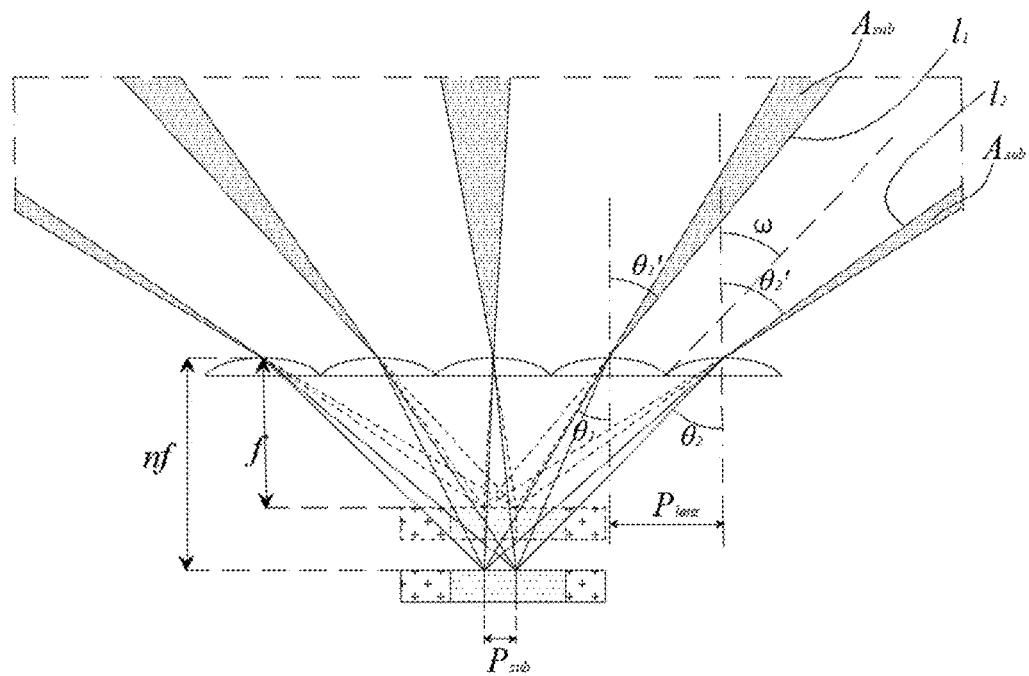
FIG. 15 is a schematic diagram showing distribution of a nearest limit of a sub-pixel in a display assembly according to an embodiment of the present disclosure.

Referring to FIG. 14, the curve is the nearest limit of the 3D visible space, and the projected width of the boundaries of the corresponding two adjacent visual sub-regions $A_{sub}$ of the same sub-pixel 120 at the nearest limit is equal to the width of the pupil distance of the human eyes. In FIGS. 14 and 15, the straight lines $l_1$ and $l_2$ are the boundaries of two adjacent visual sub-regions $A_{sub}$ corresponding to the same sub-pixel 120 under an angle of view ω. It is assumed that the incident angle of one of the boundaries is $θ_1$ and the refraction angle is $θ_1'$, the incident angle of the other boundaries is $θ_2$, and the refraction angle is $θ_2'$, then:

$$n \sin θ_1 = \sin θ_1' \quad (2)$$

$$n \sin θ_2 = \sin θ_2' \quad (3)$$

$$nf \tan θ_2 - nf \tan θ_1 = p_{lens} - p_{sub} \quad (4)$$

$$ω = \frac{θ_1' + θ_2'}{2} \quad (5)$$

$$2\frac{L_n}{\cos ω} * \tan \frac{θ_2' - θ_1'}{2} = D_n \quad (6)$$

In above formulas, $D_n$ is equal to the width of the pupil distance of the human eyes, which is usually 65 mm, and n is the refractive index of the lenticular lens 210, which is usually 1.5. From (2)~(6), $θ_1$, $θ_1'$, $θ_2$, $θ_2'$ can be eliminated to obtain the following functional relationship:

$$L_n = y(f, p_{lens}, p_{sub}, ω) \quad (7)$$

It can be seen from the above functional relationship that the nearest limit $L_n$ is a functional formula with respect to the focal length f, the pitch $P_{lens}$ of the lenticular lenses 210, the pitch $P_{sub}$ of the sub-pixels 120, and the angle of view ω.

Figure 16:
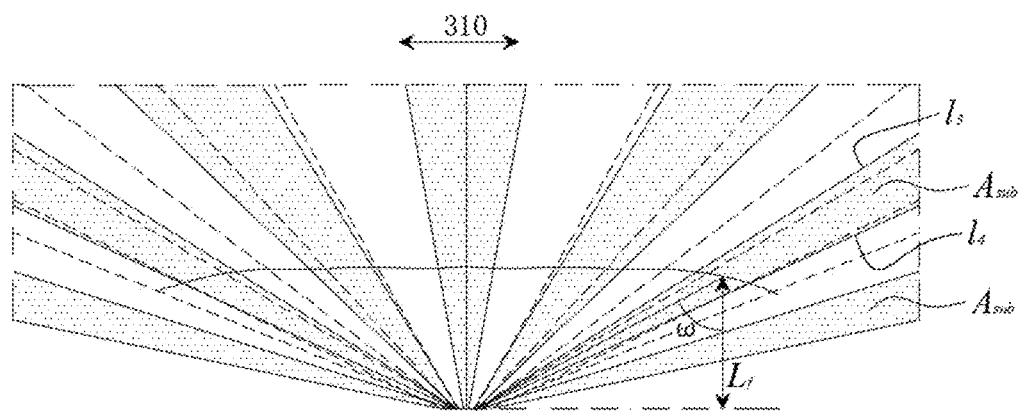
FIG. 16 is a schematic diagram showing distribution of a farthest limit of a sub-pixel in a display assembly according to an embodiment of the present disclosure.
Figure 17:
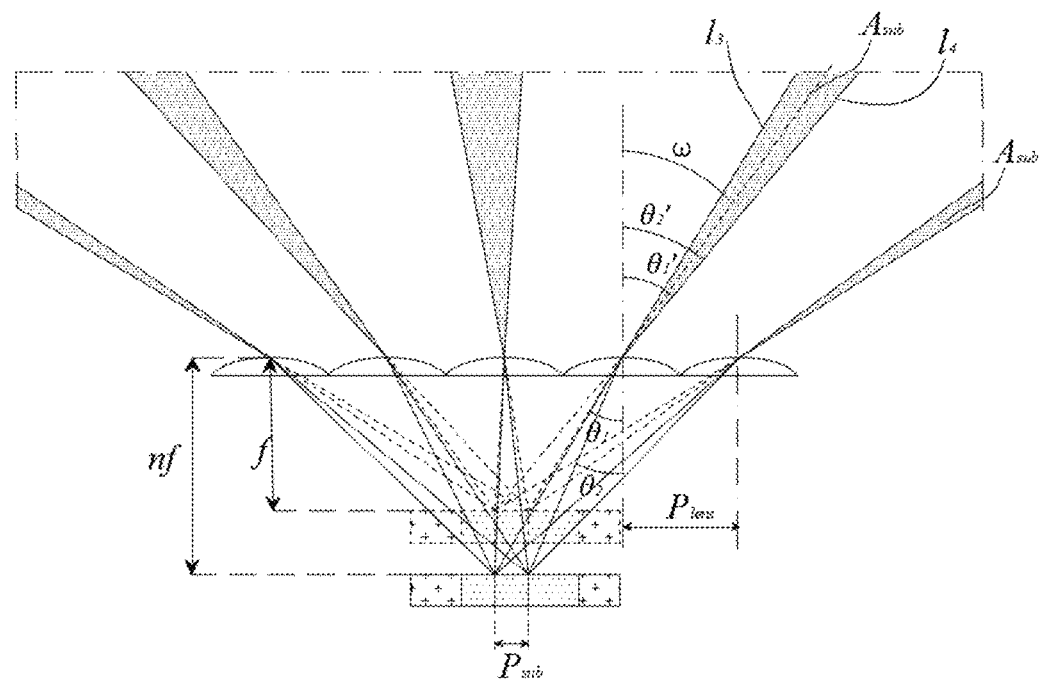
FIG. 17 is a schematic diagram showing distribution of a farthest limit of a sub-pixel in a display assembly according to an embodiment of the present disclosure.

The curve in FIG. 16 is the farthest limit of the 3D visible space. The projected width of two boundaries of a visual sub-region $A_{sub}$ at the farthest limit is equal to the width of the pupil distance of the human eyes. In FIG. 16 and FIG. 17, the straight lines $l_3$ and $l_4$ are the boundaries of a visual sub-region $A_{sub}$ under the angle of view ω. It is assumed that the incident angle of one of the boundaries is $θ_3$, and the refraction angle is $θ_3'$, and the incident angle of the other boundary is assumed to be $θ_4$ and the refraction angle is θ4', then:

$$n \sin θ_3 = \sin θ_3' \quad (8)$$

$$n \sin θ_4 = \sin θ_4' \quad (9)$$

$$nf \tan θ_4 - nf \tan θ_3 = p_{sub} \quad (10)$$

$$ω = \frac{θ_3' + θ_4'}{2} \quad (11)$$

$$2\frac{L_f}{\cos ω} * \tan \frac{θ_4' - θ_3'}{2} = D_f \quad (12)$$

In the formulas, $D_f$ is equal to the width of the pupil distance of the human eyes, which is usually 65 mm, and n is the refractive index of the lenticular lens 210, which is usually 1.5. From (8)~(12), $θ_3$, $θ_3'$, $θ_4$, $θ_4'$ can be eliminated to obtain the following functional relationship:

$$L_f = y(f, p_{sub}, ω) \quad (13)$$

It can be seen from the above functional relationship that the farthest limit $L_f$ is a functional formula with respect to the focal length f, the pitch $P_{sub}$ of the sub-pixels 120, and the angle of view ω.

In the following, according to formulas (7) and (13), mobile products (such as smart phones) and monitor products (such as computer monitors) are taken as examples to illustrate the data relationship between the nearest limit $L_n$, the farthest limit $L_f$, and the focal length f of each lenticular lens 210, pitch $P_{lens}$ of the lenticular lenses 210, the pitch $P_{sub}$ of the sub-pixels 120, and the angle of view ω.

In an example, when the display assembly is applied to a mobile product, the focal length of each lenticular lens 210 is equal to 62 to 82 microns, the pitch $P_{lens}$ of the lenticular lenses 210 is equal to 30 to 40 microns, and the size $D_{pixel}$ of the opening 111 of each pixel island is in the set direction 310 is equal to 30 to 40 microns.

In another example, when the display assembly is applied to a display product, the focal length of each lenticular lens 210 is equal to 300 to 400 microns, the pitch $P_{lens}$ of the lenticular lenses 210 is equal to 75 to 100 microns, and the size $D_{pixel}$ of the opening 111 of each pixel island is in the set direction 310 is equal to 75 to 100 microns.

Figure 18:
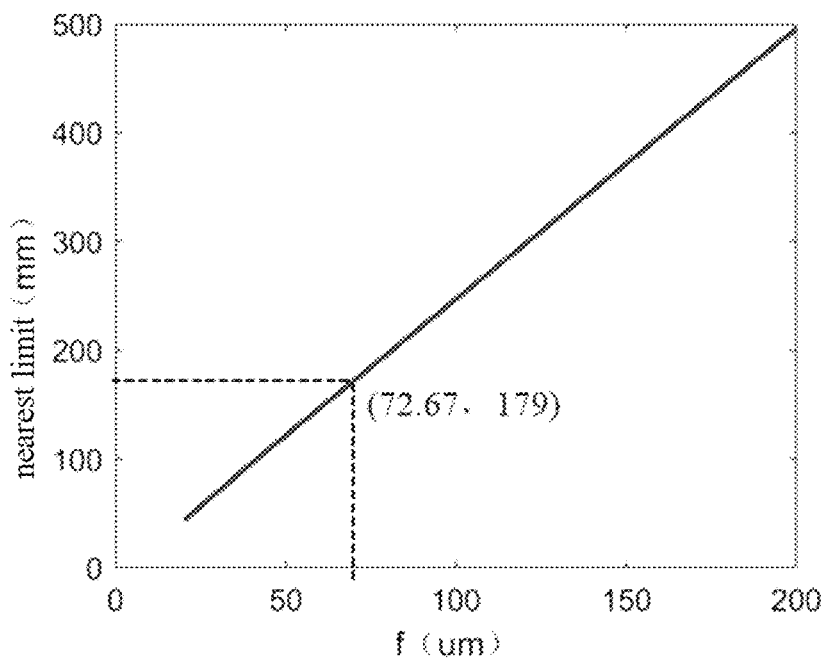
FIG. 18 is a relationship curve between nearest limits and focal lengths in a display assembly applied to a mobile product according to an embodiment of the present disclosure.
Figure 19:
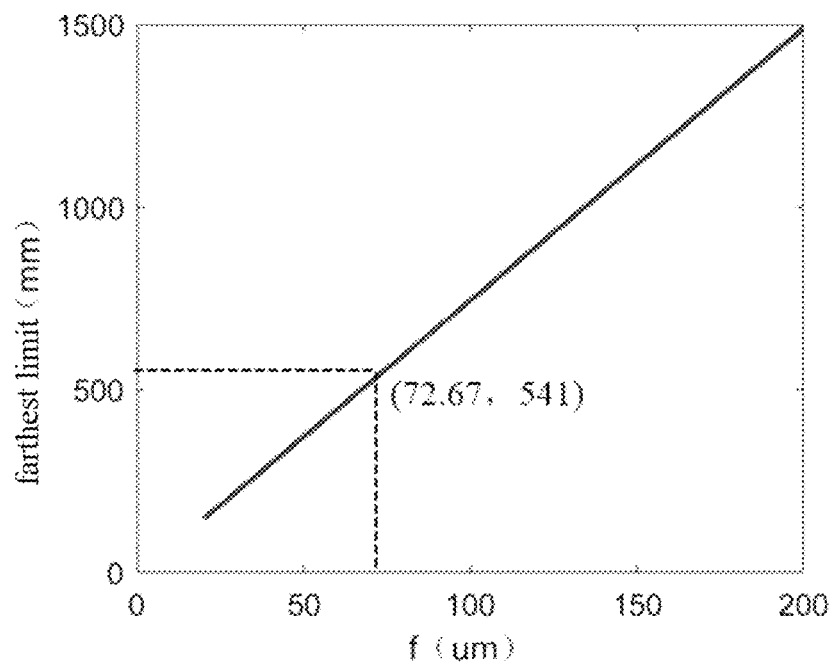
FIG. 19 is a relationship curve between farthest limits and focal lengths in a display assembly applied to a mobile product according to an embodiment of the present disclosure.
Figure 20:
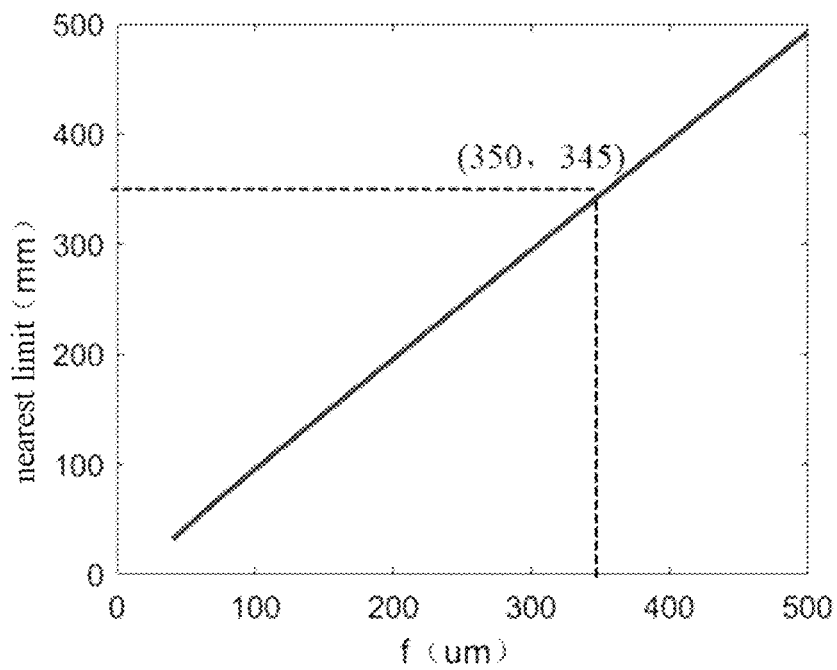
FIG. 20 is a relationship curve between nearest limits and focal lengths in a display assembly applied to a display product according to an embodiment of the present disclosure.
Figure 21:
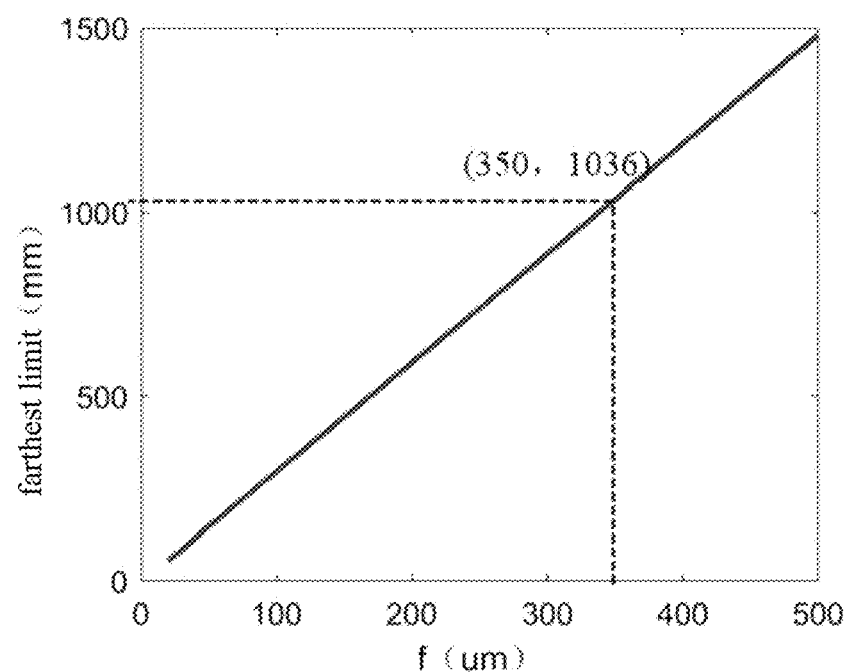
FIG. 21 is a relationship curve between farthest limits and focal lengths in a display assembly applied to a display product according to an embodiment of the present disclosure.

In an example, when the display assembly is applied to a mobile product, taking $P_{lens}$=34.9 μm, $P_{sub}$=8.725 μm, ω=0°, the relationship curve between nearest limits $L_n$ and focal lengths f as shown in FIG. 18 is obtained, and the relationship curve between farthest limits $L_f$ and focal lengths f shown in FIG. 19 is obtained. When the display assembly is applied to a display product, taking $P_{lens}$=87.8 μm, $P_{sub}$=21.95 μm, ω=0°, the relationship curve between nearest limits $L_n$ and focal lengths f as shown in FIG. 20 is obtained, and the relationship curve between farthest limits $L_f$ and focal lengths f shown in FIG. 21 is obtained.

For the convenience of the viewer and in order to make the display assembly have a larger 3D visual space, generally, the closer the nearest limit is and the farther the farthest limit is, the better the 3D display effect will be. Referring to FIG. 18 to FIG. 21, in order to reduce the nearest limit, the focal length f is required to be as small as possible; in order to increase the farthest limit, the focal length f is required to be as large as possible. The requirements of the nearest and farthest limits for the focal length f are opposite, which requires the display assembly according to embodiments of the present disclosure to strike a balance between the requirements of the nearest and farthest limits.

If the display assembly according to embodiments of the present disclosure needs to be applied to a mobile product, the optimal viewing distance of the display assembly according to embodiments of the present disclosure may be set to 250 mm-350 mm; correspondingly, in combination with the nearest and farthest limits data, the focal length f of each lenticular lens 210 may be equal to 62~82 μm. Preferably, the focal length of each lenticular lens 210 of the display assembly can be set to f=72.67 μm.

If the display assembly according to embodiments of the present disclosure needs to be applied to a display product, the optimal viewing distance of the display assembly according to embodiments of the present disclosure can be set to be 500 mm~800 mm; correspondingly, in combination with the nearest and farthest limits data, the focal length f of each lenticular lens 210 of the display assembly may be equal to 300~400 µm. Preferably, the focal length f of each lenticular lens 210 of the display assembly can be set to f=350 µm.

Figure 22:
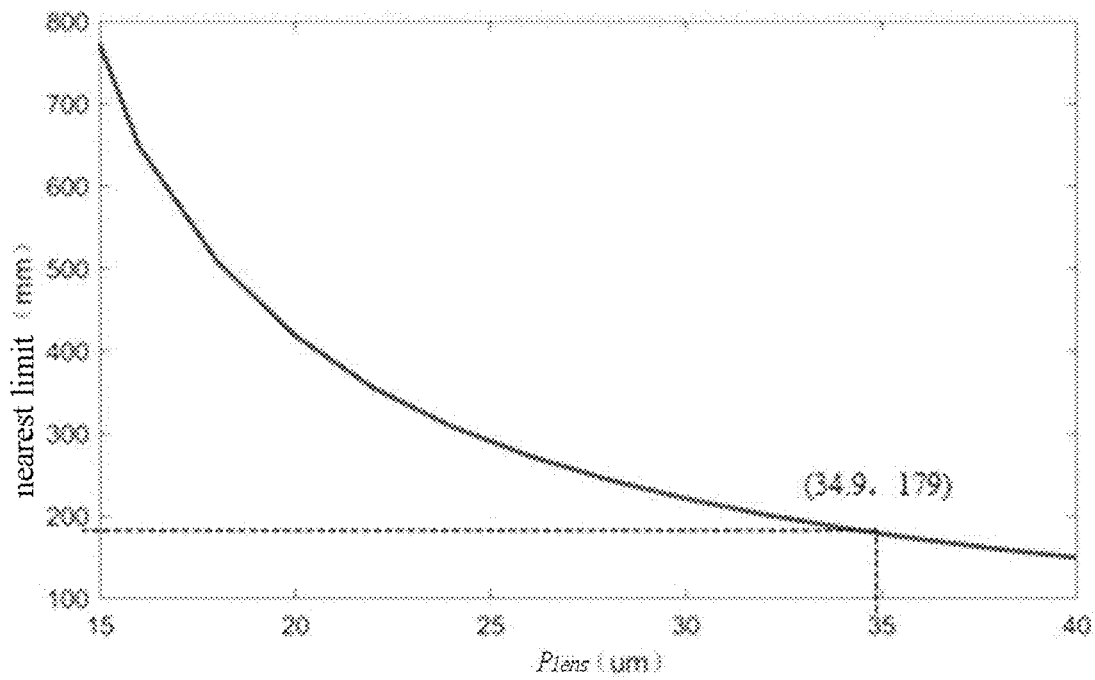
FIG. 22 is a relationship curve between nearest limits and lenticular lens pitches in a display assembly applied to a mobile product according to an embodiment of the present disclosure.
Figure 23:
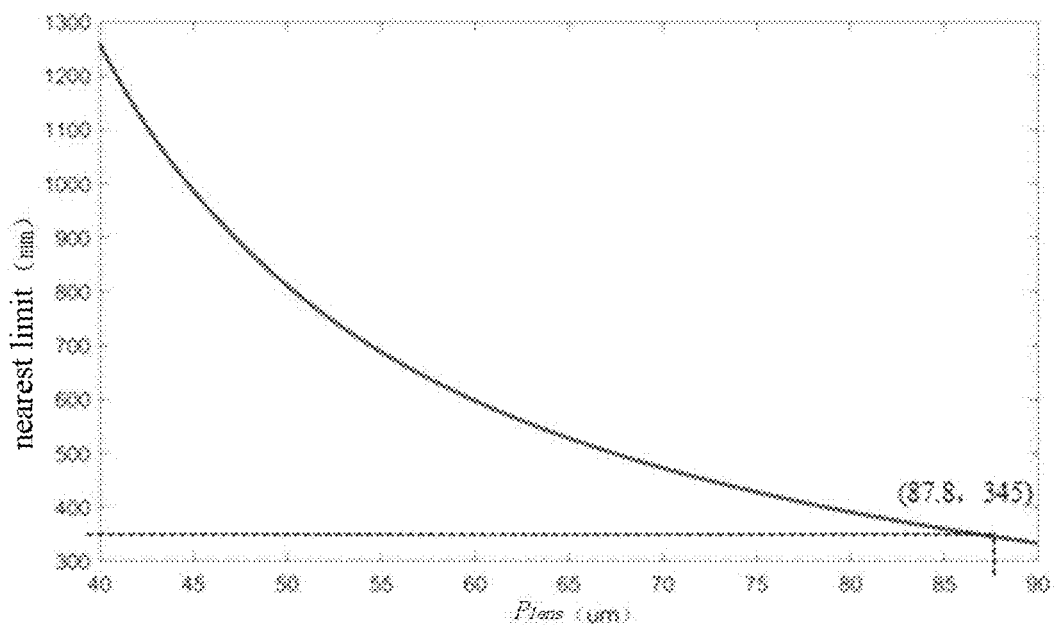
FIG. 23 is a relationship curve between nearest limits and lenticular lens pitches in a display assembly applied to a display product according to an embodiment of the present disclosure.

In another example, it can be known from formulas (7) and (13) that the pitch $P_{lens}$ of the lenticular lenses 210 only affects the nearest limit and does not affect the farthest limit. Therefore, when the display assembly is applied to a mobile product, f=72.67 µm, $P_{sub}$=8.725 µm, and ω=0°, and the relationship curve between nearest limits and the pitches $P_{lens}$ of the lenticular lenses 210 as shown in FIG. 22 is obtained. When the display assembly is applied to a display product, f=350 µm, $P_{sub}$=21.95 µm, and ω=0°, and the relationship curve between nearest limits and pitches $P_{lens}$ of the lenticular lenses 210 as shown in FIG. 23 is obtained. Since the closer the nearest limit $L_n$ is, the better the 3D display effect will be, it can be seen from FIG. 22 and FIG. 23 that the pitch the lenticular lenses 210 is as $P_{lens}$ of large as possible.

However, the pitch the lenticular lenses 210 is at most equal to the size $P_{lens}$ of $D_{pixel}$ of the opening 111 of the pixel island in the set direction 310, and the size $D_{pixel}$ of the opening 111 of the pixel island in the set direction 310 is usually limited by the size of the pixel island 110 and cannot be too large, and the size of the pixel island 110 also needs to meet the retina-level resolution. In a specific example, when the display assembly is applied to a mobile product, the pitch $P_{pixel}$ of the pixel islands 110 in the set direction 310 is required to be 54.9 µm, and the pitch of the pixel islands 110 in the first direction 320 is required to be 36.6 µm, and the maximum size of the opening 111 of each the pixel island in the set direction 310 is 34.9 µm, and accordingly the maximum pitch Peens of the lenticular lenses 210 is 34.9 µm. In another specific example, when the display assembly is applied to a display product, the pitch of pixel islands 110 in the set direction 310 is required to be 102.8 µm, the maximum size of the opening 111 of each pixel island in the set direction 310 is 87.8 µm, and accordingly the pitch $P_{lens}$ of the lenticular lenses 210 is at most 87.8 µm.

Figure 24:
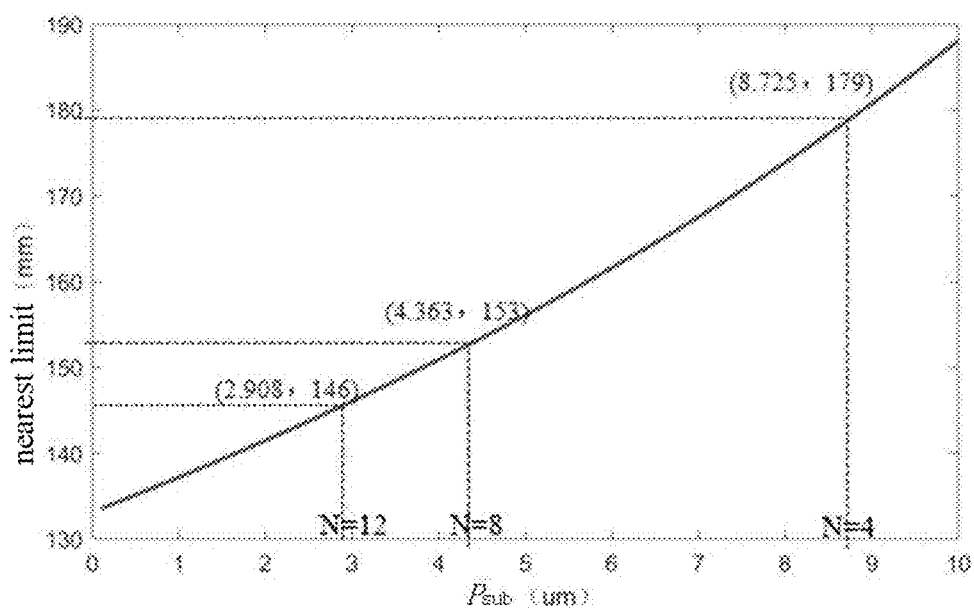
FIG. 24 is a relationship curve between the proximity limit and the arrangement pitch of sub-pixels in a set direction in a display assembly applied to a mobile product according to an embodiment of the present disclosure.
Figure 25:
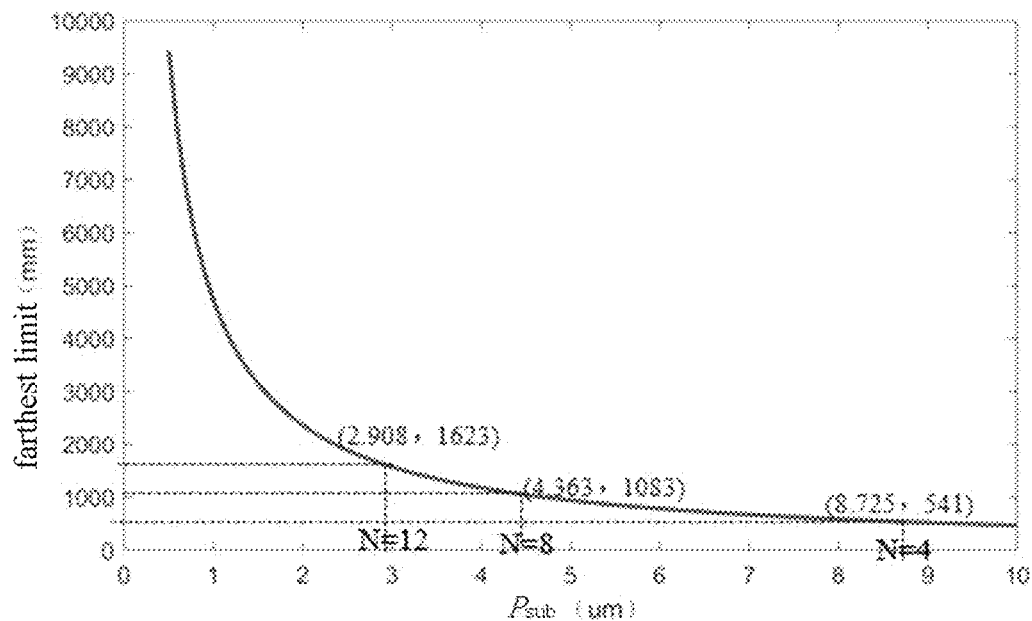
FIG. 25 is a relationship curve between farthest limits and sub-pixel pitches in a set direction in a display assembly applied to a mobile product according to an embodiment of the present disclosure.

In another example, when the display assembly is applied to a mobile product, f=72.67 µm, $P_{lens}$=34.9 µm, and ω=0°, a relationship curve between nearest limits $L_n$ and pitches $P_{sub}$ of the sub-pixels 120 in the set direction 310 as shown in FIG. 24 is obtained, and a relationship curve between farthest limits $L_f$ and pitches $P_{sub}$ of the sub-pixels 120 in the set direction 310 as shown in FIG. 25 is obtained. When the display assembly is applied to a display product, f=350 µm, $P_{lens}$=87.8 and ω=0°, a relationship curve between nearest limits $L_n$ and pitches $P_{sub}$ of the sub-pixels 120 in the set direction 310 as shown in FIG. 26 is obtained, and a relationship curve between farthest limits $L_f$ and pitches $P_{sub}$ of the sub-pixels 120 in the set direction 310 as shown in FIG. 27 is obtained.

It can be seen from FIGS. 24 to 27 that the smaller the pitch $P_{sub}$ of the sub-pixels 120 in the set direction 310 is, the closer the nearest limit is, and the farther the farthest limit is. Therefore, a greater the number of sub-pixels 120 in each pixel island 110, and a smaller pitch $P_{sub}$ of the sub-pixels 120 in the set direction 310 can result in a larger 3D visual space range.

Figure 26:
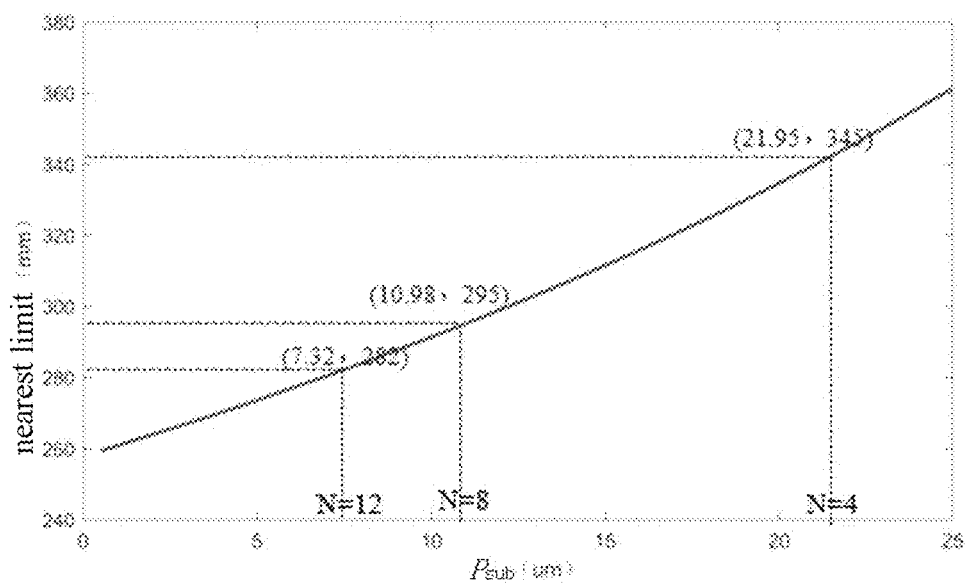
FIG. 26 is a relationship curve between nearest limits and sub-pixel pitches in a set direction in a display assembly applied to a display product according to an embodiment of the present disclosure.

For example, in FIG. 24 and FIG. 26, the nearest limits corresponding to cases where there are 4 sub-pixels 120 in a pixel island 110, there are 8 sub-pixels 120 in a pixel island, and there are 12 sub-pixels 120 in a pixel island 110 are marked. It can be further clarified from FIG. 24 and FIG. 26 that the greater the number of sub-pixels 120 in a pixel island 110, the nearer the nearest limit of the display assembly is.

Figure 27:
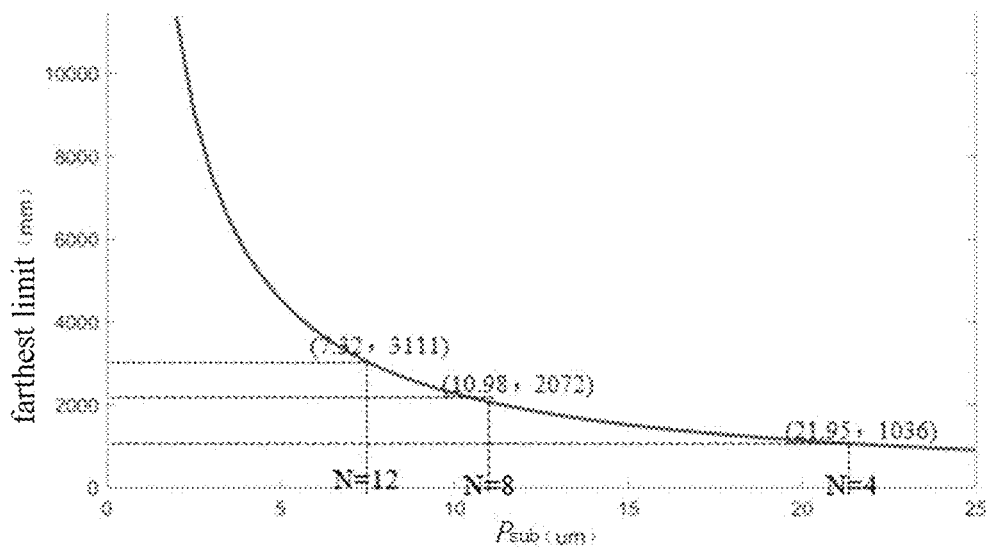
FIG. 27 is a relationship curve between farthest limits and sub-pixel pitches in a set direction in a display assembly applied to a display product according to an embodiment of the present disclosure.

For example, in FIG. 25 and FIG. 27, the farthest limits corresponding to cases where there are 4 sub-pixels 120 in a pixel island 110, there are 8 sub-pixels 120 in a pixel island, and there are 12 sub-pixels 120 in a pixel island 110 are marked. It can be further clarified from FIG. 25 and FIG. 27 that the greater the number of sub-pixels 120 in a pixel island 110, the farther the farthest limit of the display assembly is.

Figure 28:
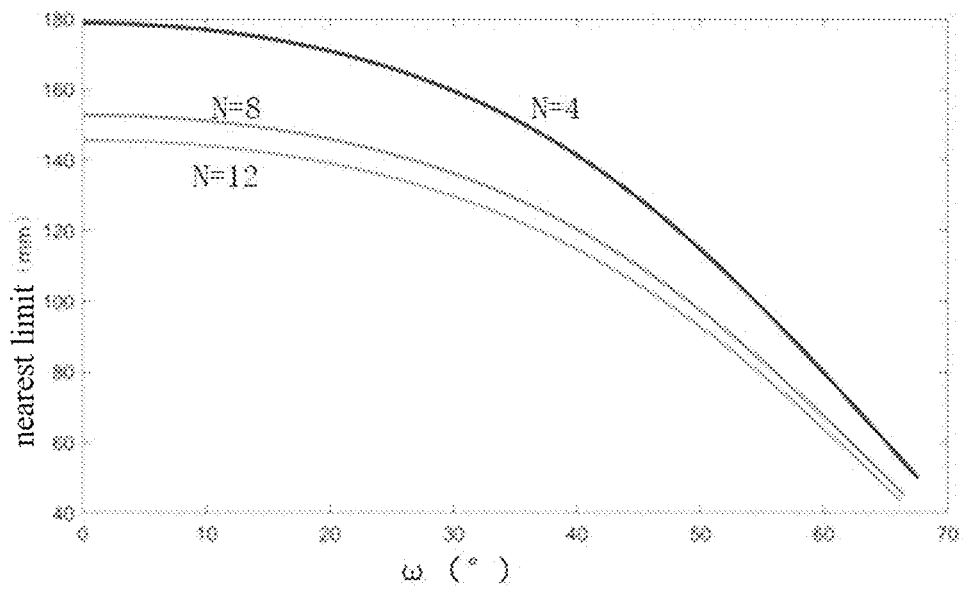
FIG. 28 is relationship curve between nearest limits and angles of view in a display assembly applied to a mobile product according to an embodiment of the present disclosure.
Figure 29:
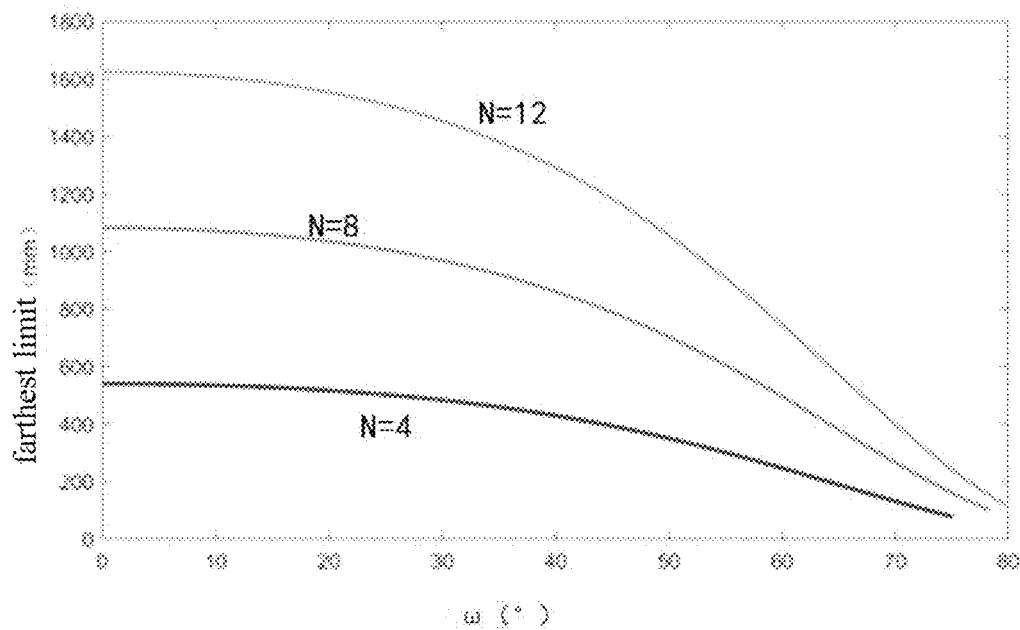
FIG. 29 is a relationship curve between farthest limits and angles of view in a display assembly applied to a mobile product according to an embodiment of the present disclosure.
Figure 30:
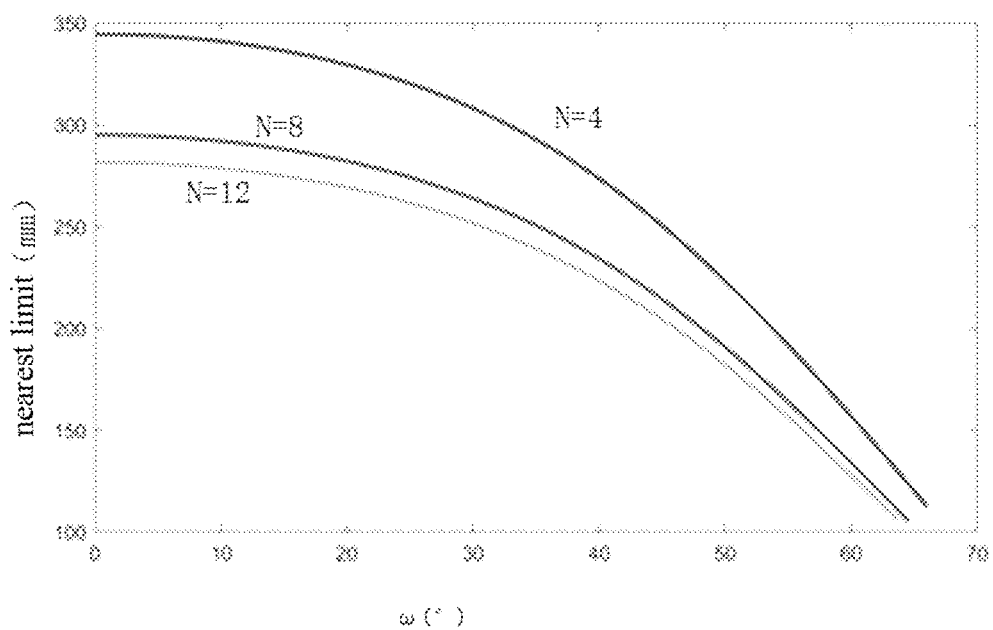
FIG. 30 is a relationship curve between nearest limits and angles of view in a display assembly applied to a display product according to an embodiment of the present disclosure.
Figure 31:
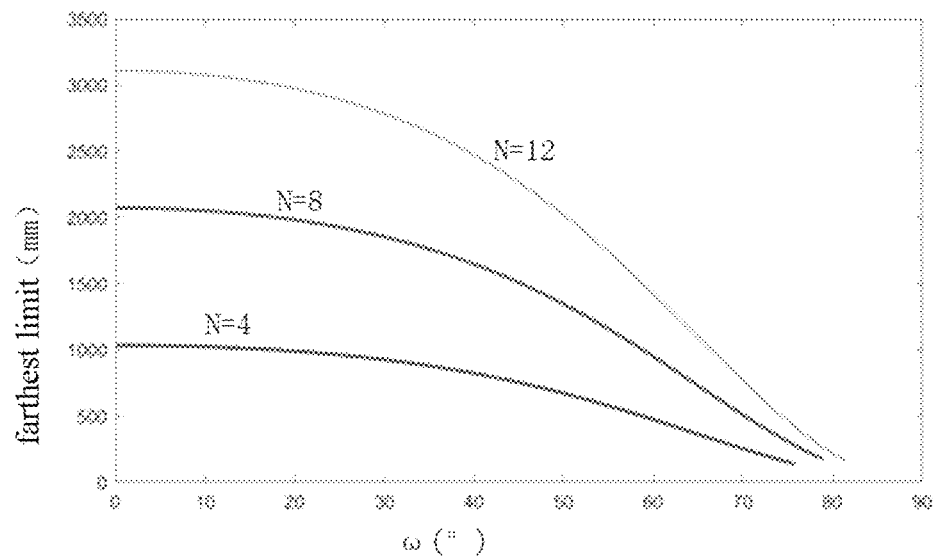
FIG. 31 is a relationship curve between farthest limits and angles of view in a display assembly applied to a display product according to an embodiment of the present disclosure.

In an example, when the display assembly according to embodiments of the present disclosure is applied to a mobile product, f=72.67 µm, $P_{lens}$=34.9 and the number N of sub-pixels 120 is 4, 8, and 12, respectively, a relationship curve between nearest limits and angles of view ω as shown in FIG. 28 is obtained, and a relationship curve between farthest limits and angles of view ω as shown in FIG. 29 is obtained. When the display assembly of the present disclosure is applied to a display product, f=350 µm, $P_{lens}$=87.8 and the number N of sub-pixels 120 is 4, 8, and 12, respectively, a relationship curve between nearest limits and angles of view ω as shown in FIG. 30 is obtained, and a relationship curve between farthest limits and angles of view ω as shown in FIG. 31 is obtained. It can be seen from FIGS. 28 to 31 that as the angle of view increases, the values of the nearest limit and farthest limit both decrease, and the 3D visual space as a whole approaches the screen.

Figure 32:
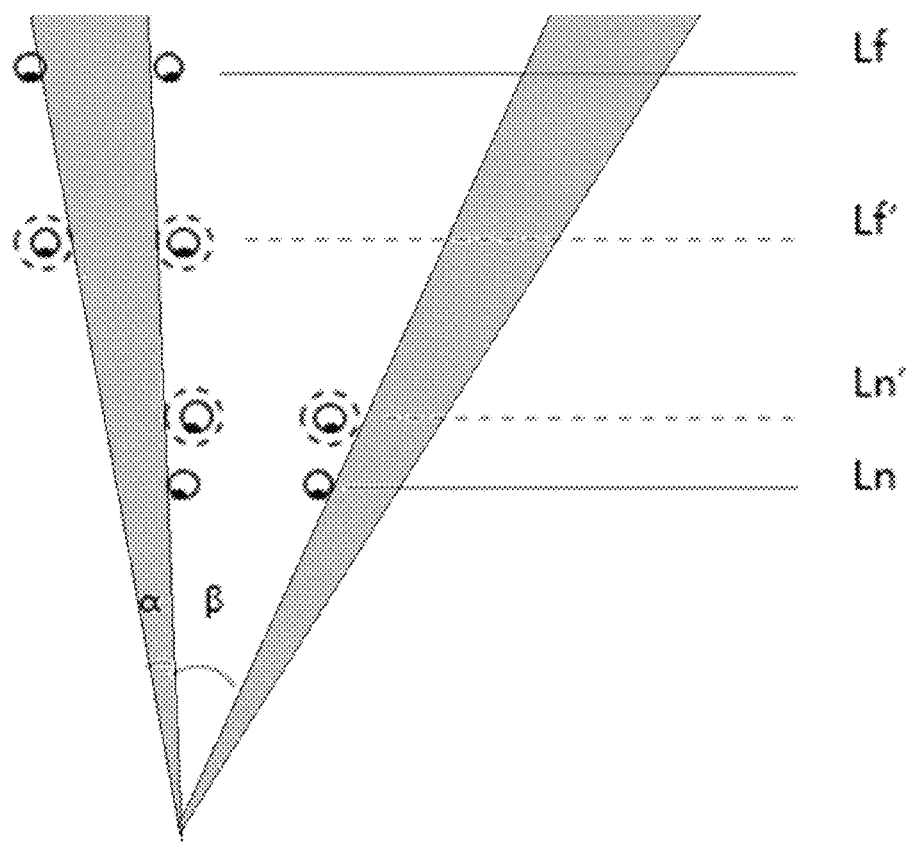
FIG. 32 is a schematic diagram illustrating an influence of tracking error on farthest and nearest limits in a display assembly according to an embodiment of the present disclosure.

It can be understood that, in the above examples, the analysis of the nearest limit and the farthest limit of the 3D visual space is based on the precise positioning of the eyes. However, there may be some errors in the process of eye tracking, which makes the positioning accuracy of eye tracking affect the 3D visual space. In an example, as shown in FIG. 32, in order to avoid the situation where the first sub-pixel and the second sub-pixel of the pixel island 110 are the same sub-pixel 120, it is necessary to prevent both eyes from seeing the same sub-pixel 120 at the same time. It is needed that both eyes do not see the same sub-pixel 120 at the nearest limit position and the farthest limit position at the same time, and thus, when there is a certain tracking error δ in eye tracking, the tracking error δ will cause the nearest limit to become farther and the farthest limit to become nearer, that is, the 3D visible space becomes smaller.

In this example, the existence of the tracking error δ is equivalent to making the pupil distance $D_P$ of the eyes larger at the nearest limit position, and is equivalent to making the pupil distance $D_P$ of the eyes smaller at the farthest limit position.

specifically:

$$D_n = D_p + \frac{L_n}{\cos \omega} \delta \tag{13}$$

$$D_f = D_p - \frac{L_f}{\cos \omega} \delta \tag{14}$$

In the formulas, $D_P$ is the width of the pupil distance of the human eyes, $L_n$ is the nearest limit value, $L_f$ is the farthest limit value, ω is the angle of view, and δ is the tracking accuracy. We bring formulas (13) and (14) into formulas (6) and (12) respectively for calculation, and the data shown in Table 1 can be obtained.

TABLE 1

3D visual spaces of display assembly under different conditions

| application range | parameter of lenticular lenses | ω | $L_n$~$L_f$ (tracking accuracy 0°) (mm) N | | | $L_n$~$L_f$ (tracking accuracy 0°) (mm) N | | |
|---|---|---|---|---|---|---|---|---|
| | | | 4 | 8 | 12 | 4 | 8 | 12 |
| mobile product | f = 72.67 μm; $P_{lens}$ = 34.9 μm | 0° ±50° | 179~541 131~351 | 153~1082 98~703 | 146~1624 93~1056 | 188~472 121~306 | 160~838 102~544 | 152~1131 97~732 |
| display product | f = 350 μm; $P_{lens}$ = 87.8 μm | 0° ±50° | 345~1056 1223~673 | 295~2073 191~1347 | 282~3109 182~2021 | 380~810 246~525 | 321~1332 208~862 | 305~1694 197~1096 |

According to the data in Table 1, the nearest limit and the farthest limit of the display assembly exemplarily provided in Table 1 can meet the corresponding viewing requirements of the products. Specifically, when the display assembly according to embodiments of the present disclosure is applied to a mobile product, under the frontal angle of view (the angle of view is 0°), the optimal viewing distance is 250 mm-350 mm. When the display assembly according to embodiments of the present disclosure is applied to a display product, under the frontal angle of view (the angle of view is 0°), the optimum viewing distance is 500 mm to 800 mm.

An embodiment of the present disclosure further provides a display device. The display device includes any one of the display assemblies described in the above-mentioned display assembly embodiments. The display device may be a smartphone screen, a computer monitor, a digital camera frame, a tablet computer, an electronic picture screen, an electronic billboard or other types of display devices. Since the display device has any one of the display assemblies described in the above display assembly embodiments, the display device has the same beneficial effects, and details will not be repeated in the present disclosure.

Figure 42:
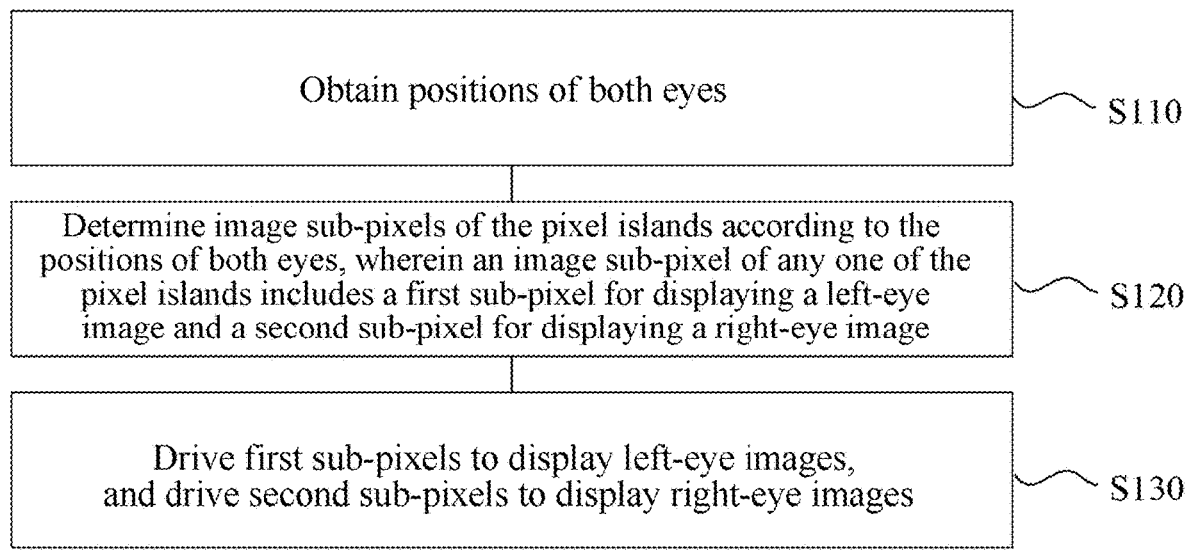
FIG. 42 is a schematic flowchart of a driving method for a display device in an embodiment.

An embodiment of the present disclosure also provides a driving method of a display device, so that the display device can realize glasses-free 3D display. The display device includes any one of the display assemblies described in the above display assembly embodiments. As shown in FIG. 42, the driving method of the display device may include the following steps:

In step S110, positions of both eyes are obtained.

In step S120, image sub-pixels 120 of the pixel islands 110 are determined according to the positions of both eyes. An image sub-pixel 120 of any one of the pixel islands 110 includes a first sub-pixel for displaying a left-eye image and a second sub-pixel for displaying a right-eye image.

In step S130, first sub-pixels are driven to display left-eye images, and second sub-pixels are driven to display right-eye images.

According to the above-mentioned driving method of the display device, the display device can be driven to realize glasses-free 3D display.

Figure 33:
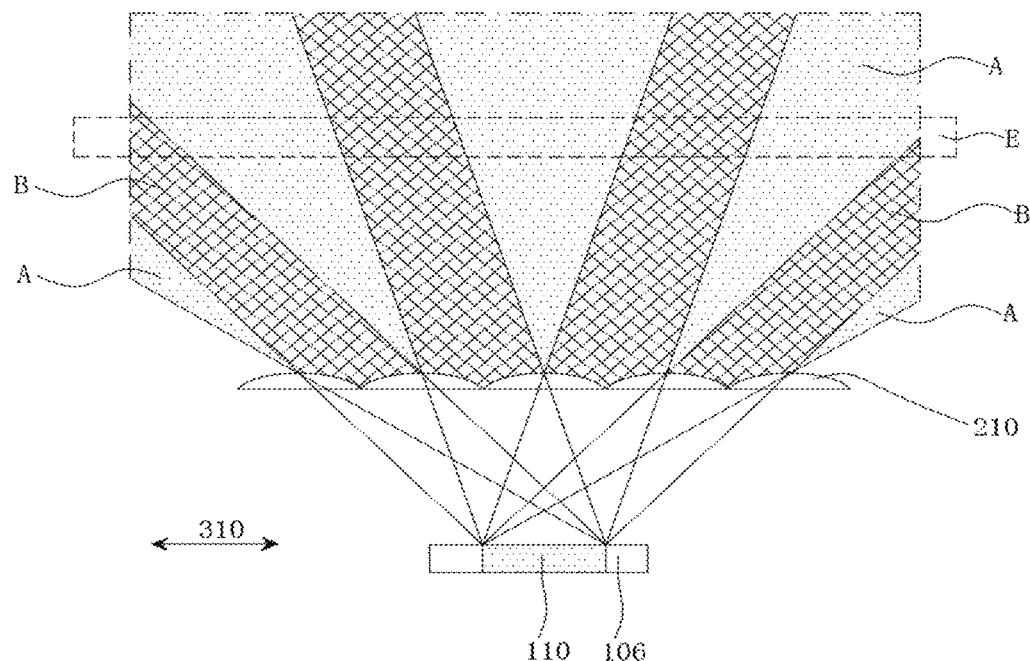
FIG. 33 is a schematic diagram of distribution of light projected by a pixel island through lenticular lenses in a display assembly according to an embodiment of the present disclosure.
Figure 34:
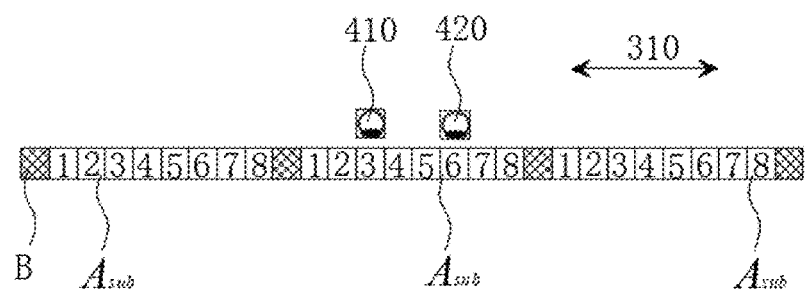
FIG. 34 is a schematic diagram showing a relationship between the pupils of the eyes and visual sub-regions when the eyes are within the dotted line frame E in FIG. 33 in an embodiment.
Figure 35:
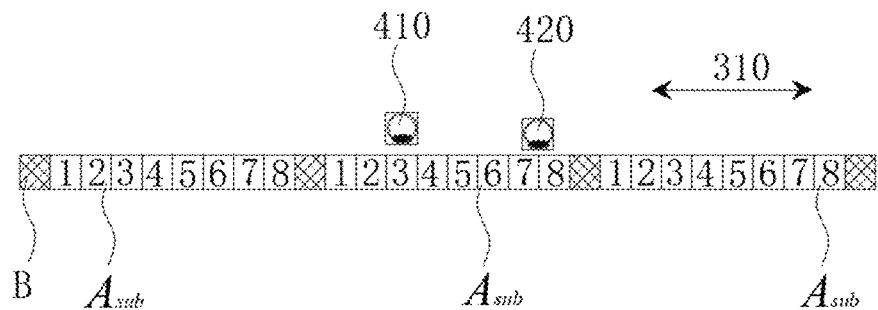
FIG. 35 is a schematic diagram showing a relationship between the pupils of the eyes and visual sub-regions when the eyes are within the dotted line frame E in FIG. 33 in an embodiment.

In an embodiment of the present disclosure, in the display assembly, the pitch $P_{lens}$ of the lenticular lenses 210 is equal to the size $D_{pixel}$ of the opening 111 of each pixel island in the set direction 310. FIG. 11 shows the corresponding visual sub-regions $A_{sub}$ projected by the sub-pixels 120 of a pixel island through the same lenticular lens 210. FIG. 33 shows a plurality of visual regions A projected by a pixel island 110 through a plurality of adjacent lenticular lenses 210. FIG. 34 and FIG. 35 show the arrangement of visual sub-region $A_{sub}$ of the pixel island 110 in the dotted line frame E in FIG. 33, and exemplarily show the positional relationship between eyes and visual sub-regions $A_{sub}$ when both eyes are located in the dotted line frame E.

In step S120, the first sub-pixel and the second sub-pixel of each pixel island 110 may be determined according to the positions of the eyes. With reference to FIGS. 33 to 35, determination of the first sub-pixel and the second sub-pixel of any pixel island 110 include the following steps:

In step S210, from visual sub-regions $A_{sub}$ of the pixel island 110, a visual sub-region $A_{sub}$ where the pupil 410 of the left eye is located is determined as the first visual sub-region $A_{sub}$.

In step S220, a sub-pixel 120 corresponding to the first visual sub-region $A_{sub}$ is determined as the first sub-pixel of the pixel island 110.

In step S230, from visual sub-regions $A_{sub}$ of the pixel island 110, a visual sub-region $A_{sub}$ where the pupil 420 of the right eye is located is determined as a second visual sub-region $A_{sub}$.

In step S240, a sub-pixel 120 corresponding to the second visual sub-region $A_{sub}$ is determined as a second sub-pixel of the pixel island 110.

Any one of the visual sub-regions $A_{sub}$ of the pixel island 110 is a spatial region projected by a sub-pixel 120 of the pixel island 110 through a lenticular lens 210.

It should be noted that although the various steps of the methods of embodiments of the present disclosure are described in the specification in a specific order, this does not require or imply that the steps must be performed in the specific order, or that all of the steps shown must be performed to achieve desired result. Additionally or alternatively, certain steps may be omitted, multiple steps may be combined into one step, and/or one step may be decomposed into multiple steps, etc., all of such modifications should be considered as part of the present disclosure. In the above steps, step S210 and step S220 can be used as one working process, and step S230 and step S240 can be used as another working process; the two working processes can be executed sequentially or simultaneously. For example, in an embodiment of the present disclosure, steps S210 to S240 may be performed in sequence. For another example, in another embodiment of the present disclosure, step S230, step S240, step S210 and step S220 may be performed in sequence. For another example, in another embodiment of the present disclosure, step S210, step S230, step S220, and step S240 may be performed in sequence. For another example, step S210, step S230, step S240, and step S220 may be performed in sequence. Of course, steps S210 to S240 may be performed in other sequences, so as to determine the first sub-pixel and the second sub-pixel.

Exemplarily, N is defined as the number of sub-pixels 120 continuously arranged along the set direction 310 in the pixel island 110, N is an integer greater than 1; i and j are both positive integers, and $1 \leq i \leq N$; $1 \leq j \leq N$.

If the pupil 410 of the left eye is located in the visual sub-region $A_{sub}(i)$ corresponding to the i-th sub-pixel $P_{sub}(i)$, the visual sub-region $A_{sub}(i)$ is determined as the first visual sub-region, and then the i-th sub-pixel $P_{sub}(i)$ is determined as the first sub-pixel of the pixel island 110. For example, referring to FIGS. 34 and 35, the pupil 410 of the left eye is located in the visual sub-region $A_{sub}(3)$, then it is determined that the sub-pixel $P_{sub}(3)$ corresponding to the visual sub-region $A_{sub}(3)$ is the first sub-pixel of the pixel island 110.

If the pupil 410 of the left eye is located in the visual sub-region $A_{sub}(i)$ corresponding to the i-th sub-pixel $P_{sub}(i)$ and the visual sub-region $A_{sub}(i-1)$ corresponding to the i-1-th sub-pixel $P_{sub}(i-1)$, and i-1≥1, then the visual sub-region $A_{sub}(i)$ and the visual sub-region $A_{sub}(i-1)$ are determined as the first visual sub-regions, and then the i-th sub-pixel $P_{sub}(i)$ and the (i-1)-th sub-pixel $P_{sub}(i-1)$ are determined as the first sub-pixels of the pixel island 110. In other words, if the pupil 410 of the left eye spans two adjacent visual sub-regions $A_{sub}$, the two visual sub-regions $A_{sub}$ are determined as the first visual sub-regions of the pixel island, and the two sub-pixels $P_{sub}$ corresponding to the two visual regions $A_{sub}$ are determined as the first sub-pixels of the pixel island 110.

If the pupil 420 of the right eye is located in the visual sub-region $A_{sub}(j)$ corresponding to the j-th sub-pixel $P_{sub}(j)$, the visual sub-region $A_{sub}(j)$ is determined as the second visual sub-region, and the j-th sub-pixel $P_{sub}(j)$ is determined as the second sub-pixel of the pixel island 110. For example, referring to FIG. 34, the pupil 420 of the right eye is located in the visual sub-region $A_{sub}(6)$, and the sub-pixel $P_{sub}(6)$ is determined as the second sub-pixel of the pixel island 110.

If the pupil 420 of the right eye is located in the visual sub-region $A_{sub}(j)$ corresponding to the j-th sub-pixel $P_{sub}(j)$ and the visual sub-region $A_{sub}(j+1)$ corresponding to the (j+1)-th sub-pixel $P_{sub}(j+1)$, and (j+1)≤N, then the visual sub-region $A_{sub}(j)$ and the visual sub-region $A_{sub}(J+1)$ are determined as the second visual sub-regions $A_{sub}$, and the j-th sub-pixel $P_{sub}(j)$ and the (j+1)-th sub-pixel $P_{sub}(j+1)$ are determined as the second sub-pixels of the pixel island 110. In other words, if the pupil 420 of the right eye spans two adjacent visual sub-regions $A_{sub}$, the two visual sub-regions $A_{sub}$ are determined as the second visual sub-regions of the pixel island, and the two sub-pixels $P_{sub}$ corresponding to the two visual sub-regions $A_{sub}$ are determined as the second sub-pixels of the pixel island 110. For example, referring to FIG. 35, the pupil 420 of the right eye spans the visual sub-region $A_{sub}(7)$ and the visual sub-region $A_{sub}(8)$, then the visual sub-region $A_{sub}(7)$ and the visual sub-region $A_{sub}(8)$ are determined as the second visual sub-regions of the pixel island, and the sub-pixels $P_{sub}(7)$ and $P_{sub}(8)$ are determined as the second sub-pixels of the pixel island.

Figure 36:
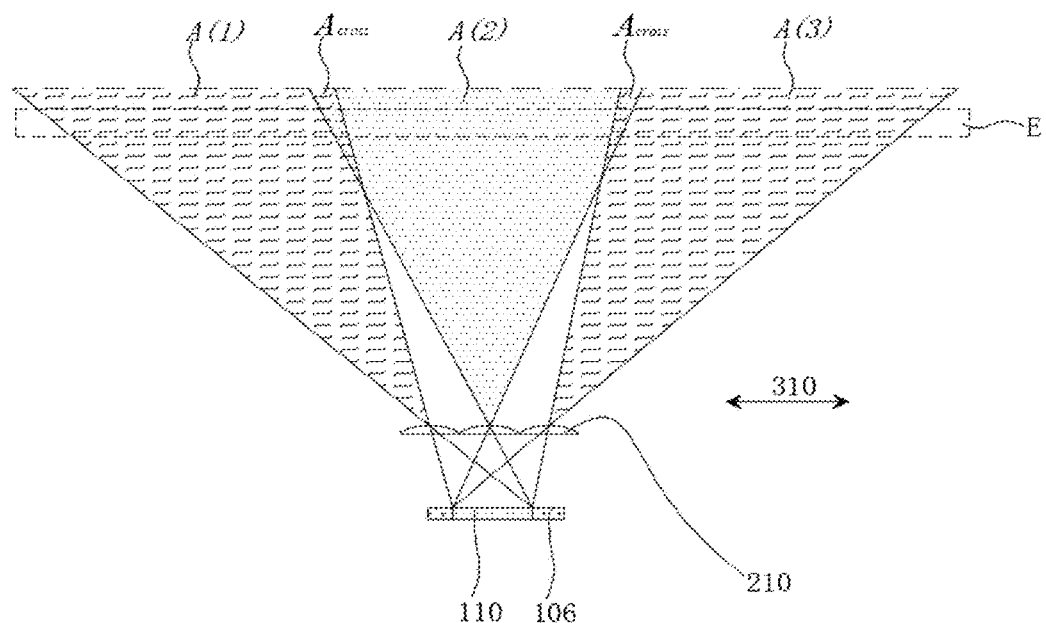
FIG. 36 is a schematic diagram showing distribution of light projected by a pixel island through lenticular lenses in a display assembly according to an embodiment of the present disclosure.
Figure 37:
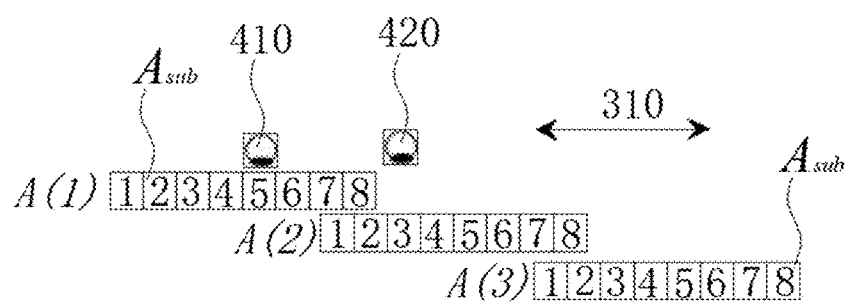
FIG. 37 is a schematic diagram showing a relationship between the pupils of the eyes and visual sub-regions when the eyes are within the dotted line frame E in FIG. 36 in an embodiment.
Figure 38:
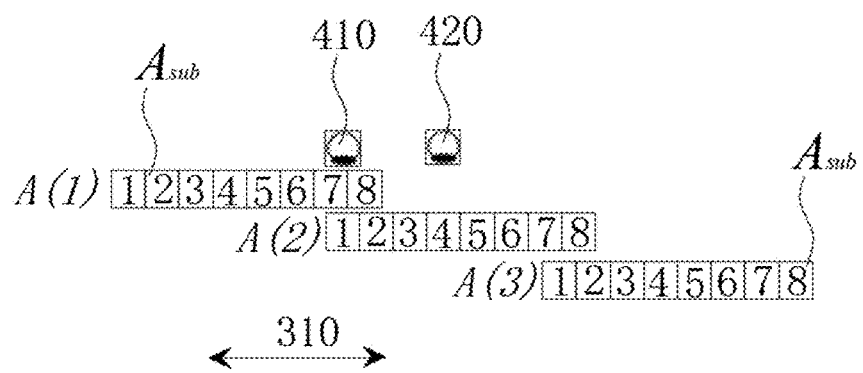
FIG. 38 is a schematic diagram showing a relationship between the pupils of the eyes and visual sub-regions when the eyes are within the dotted line frame E in FIG. 36 in an embodiment.
Figure 39:
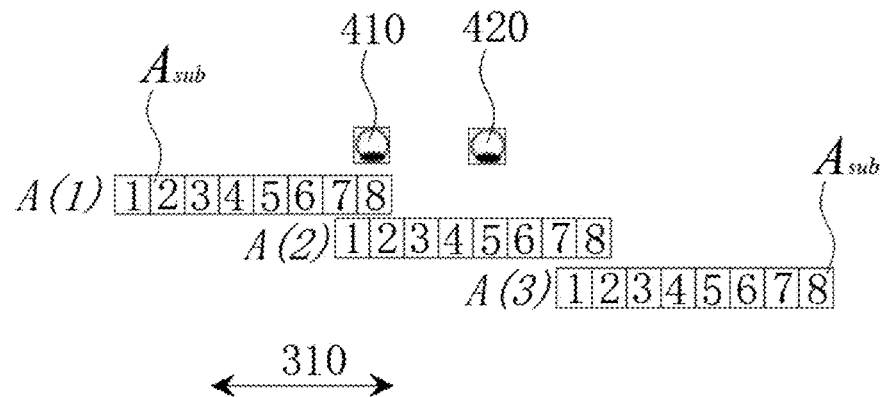
FIG. 39 is a schematic diagram showing a relationship between the pupils of the eyes and visual sub-regions when the eyes are within the dotted line frame E in FIG. 36 in an embodiment.

In another embodiment of the present disclosure, the pitch $P_{lens}$ of the lenticular lenses 210 is smaller than the size $D_{pixel}$ of the opening 111 of the pixel island in the set direction 310. FIG. 11 shows the corresponding visual sub-regions $A_{sub}$ projected by the sub-pixels 120 of a pixel island through the same lenticular lens 210. FIG. 36 shows a plurality of visual regions A projected by a pixel island 110 through a plurality of adjacent lenticular lenses 210. The adjacent visual regions A may partially overlap to form an overlapping region $A_{cross}$. FIG. 37 to FIG. 39 show the arrangement of visual sub-region $A_{sub}$ of the pixel island 110 in the dotted line frame E in FIG. 36, and exemplarily show the positional relationship between eyes and visual sub-regions $A_{sub}$ when both eyes are located in the dotted line frame E. According to the examples of FIGS. 37 to 39, at the dotted line frame E in FIG. 36, a part of the visual sub-region $A_{sub}(7)$ of the visual region A(1) and the visual sub-region $A_{sub}(8)$ are located in the overlapping region $A_{cross}$ of the visual region A(1) and the visual region A(2). A part of the visual sub-region $A_{sub}(2)$ of the visual region A(2) and the visual sub-region $A_{sub}(1)$ are located in the overlapping region $A_{cross}$ of of the visual region A(1) and the visual region A(2). A part of the visual sub-region $A_{sub}(7)$ of the visual region A(2) and the visual sub-region $A_{sub}(8)$ are located in the overlapping region $A_{cross}$ of the visual region A(2) and the visual region A(3). A part of the visual sub-region $A_{sub}(2)$ of the visual region A(3) and the visual sub-region $A_{sub}(1)$ are located in the overlapping region $A_{cross}$ of the visual region A(2) and the visual region A(3).

Step S120 may include determining the first sub-pixel and the second sub-pixel of each pixel island 110 according to the positions of the eyes. The determination of the first sub-pixel and the second sub-pixel of any pixel island 110 includes the following steps:

In step S310, whether any one of the pupil 410 of the left eye and the pupil 420 of the right eye is located in the overlapping region $A_{cross}$ of different visual regions A of the pixel island 110.

In step S320, if none of the pupil 410 of the left eye and the pupil 420 of the right eye is located in the overlapping region $A_{cross}$ of the different visual regions A of the pixel island 110, then:

In step S321, from visual sub-regions $A_{sub}$ of the pixel island 110, the visual sub-region $A_{sub}$ where the pupil 410 of the left eye is located is determined as the first visual sub-region.

In step S322, a sub-pixel 120 corresponding to the first visual sub-region is determined as the first sub-pixel of the pixel island 110.

In step S323, from visual sub-regions $A_{sub}$ of the pixel island 110, a visual sub-region $A_{sub}$ where the pupil 420 of the right eye is located is determined the second visual sub-region.

In step S324, a sub-pixel 120 corresponding to the second visual sub-region is determined as the second sub-pixel of the pixel island 110.

Illustratively, referring to FIG. 37, neither the pupil 410 of the left eye nor the pupil 420 of the right eye is located in the overlapping region $A_{cross}$. The pupil 410 of the left eye is located in the visual sub-region $A_{sub}(5)$, then the visual sub-region $A_{sub}(5)$ is determined as the first visual sub-region of the sub-pixel, and the sub-pixel $P_{sub}(5)$ corresponding to the visual sub-region $A_{sub}(5)$ is determined as the first sub-pixel of the pixel island. The pupil 420 of the right eye is located in the visual sub-region $A_{sub}(3)$, then the visual sub-region $A_{sub}(3)$ is determined as the second visual sub-region of the sub-pixel, and the sub-pixel $P_{sub}(3)$ corresponding to the visual sub-region $A_{sub}(3)$ is determined is the second sub-pixel of the pixel island.

In step S330, if the pupil 410 of the left eye is located in the overlapping region $A_{cross}$ of different visual regions A of the pixel island 110, then:

In step S331, from visual sub-regions $A_{sub}$ of the pixel island 110, a visual sub-region $A_{sub}$ where the pupil 420 of the right eye is located is determined as the second visual sub-region.

In step S332, the sub-pixel 120 corresponding to the second visual sub-region is determined as the second sub-pixel of the pixel island 110.

In step S333, from visual sub-regions $A_{sub}$ of the pixel island 110, a visual sub-region $A_{sub}$ where the pupil 410 of the left eye is located and which belongs to one of the visual regions A is determined as a first candidate visual sub-region.

In step S334, from visual sub-regions $A_{sub}$ of the pixel island 110, a visual sub-region $A_{sub}$ where the pupil 410 of the left eye is located and which belongs to the other one of the visual regions A is determined as a second candidate visual sub-region.

In step S335, on a connection line connecting the pupil 410 of the left eye and the pupil 420 of the right eye, one of the first candidate visual sub-region and the second candidate visual sub-region which has a larger distance from the second visual sub-region is selected as the first visual sub-region.

In step S336, a sub-pixel 120 corresponding to the first visual sub-region is determined as the first sub-pixel of the pixel island 110.

For example, referring to FIG. 38, the pupil 410 of the left eye is located in the overlapping region $A_{cross}$ of the visual region A(1) and the visual region A(2) of the pixel island 110. The pupil 420 of the right eye is located in the visual sub-region $A_{sub}(4)$ of the pixel island 110. The visual sub-region $A_{sub}(4)$ is determined as the second visual sub-region of the pixel island, and the sub-pixel $P_{sub}(4)$ corresponding to the visual sub-region $A_{sub}(4)$ is determined as the second sub-pixel of the pixel island. It is determined that the first candidate visual sub-region includes the visual sub-region $A_{sub}(7)$ and the visual sub-region $A_{sub}(8)$ of the visual region A(1). It is determined that the second candidate visual sub-region is the visual sub-region $A_{sub}(1)$ the visual region A(2). By comparing the distance between the first candidate visual sub-region and the second visual sub-region and the distance between the second candidate visual sub-region and the second visual sub-region, it can be found that the distance between the visual sub-region $A_{sub}(1)$ of the visual region A(2) and the second visual sub-region is larger, and thus it is determined that the visual sub-region $A_{sub}(1)$ of the visual region A(2) is the first visual sub-region of the pixel island. The sub-pixel $P_{sub}(1)$ corresponding to the visual sub-region $A_{sub}(1)$ is determined as the first sub-pixel of the pixel island.

For another example, referring to FIG. 39, the pupil 410 of the left eye is located in the overlapping region $A_{cross}$ of the visual region A(1) and the visual region A(2) of the pixel island 110. The pupil 420 of the right eye is located in the visual sub-region $A_{sub}(5)$ of the pixel island 110. The visual sub-region $A_{sub}(5)$ is determined as the second visual sub-region of the pixel island, and the sub-pixel $P_{sub}(5)$ corresponding to the visual sub-region $A_{sub}(5)$ is determined as the second sub-pixel of the pixel island. It is determined that the first candidate visual sub-region is the visual sub-region $A_{sub}(8)$ of the visual region A(1). It is determined that the second candidate visual sub-region includes the visual sub-region $A_{sub}(1)$ and visual sub-region $A_{sub}(2)$ of the visual region A(2). By comparing the distance between the first candidate visual sub-region and the second visual sub-region and the distance between the second candidate visual sub-region and the second visual sub-region, it can be found that the distance between the visual sub-region $A_{sub}(8)$ of the visual region A(1) and the second visual sub-region is larger, and thus it is determined that the visual sub-region $A_{sub}(8)$ of the visual region A(1) is the first visual sub-region of the pixel island. The sub-pixel $P_{sub}(8)$ corresponding to the visual sub-region $A_{sub}(8)$ is determined as the first sub-pixel of the pixel island.

In step S340, if the pupil 420 of the right eye is located in the overlapping region $A_{cross}$ of different visual regions A of the pixel island 110, then:

In step S341, from visual sub-regions $A_{sub}$ of the pixel island 110, a visual sub-region $A_{sub}$ where the pupil 410 of the left eye is located is determined as the first visual sub-region.

In step S342, a sub-pixel 120 corresponding to the first visual sub-region is determined as the first sub-pixel of the pixel island 110.

In step S343, from visual sub-regions $A_{sub}$ of the pixel island 110, a visual sub-region where the pupil 420 of the right eye is located and which belongs to one of the visual regions A is determined as a third candidate visual sub-region $A_{sub}$.

In step S344, from visual sub-regions $A_{sub}$ of the pixel island 110, da visual sub-region $A_{sub}$ where the pupil 420 of the right eye is located and which belongs to the other one of the visual regions A is determined as a fourth candidate visual sub-region.

In step S345, on the connection line connecting the pupil 410 of the left eye and the pupil 420 of the right eye, one of the third and fourth candidate visual sub-regions which has a larger distance from the first visual sub-region is selected as the second visual sub-region.

In step S346, a sub-pixel 120 corresponding to the second visual sub-region is determined the second sub-pixel of the pixel island 110.

Figure 40:
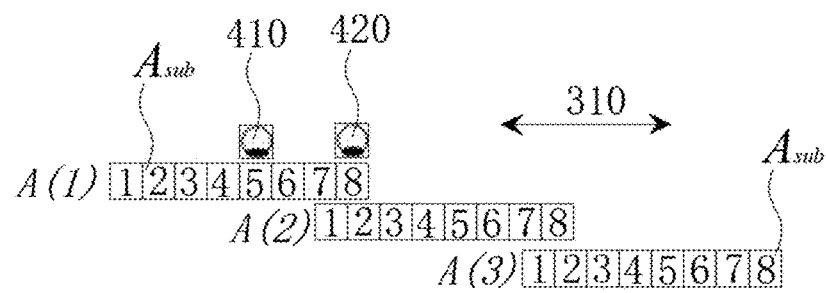
FIG. 40 is a schematic diagram showing a relationship between the pupils of the eyes and visual sub-regions when the eyes are within the dotted line frame E in FIG. 36 in an embodiment.

As an example, referring to FIG. 40, the pupil 420 of the right eye is located in the overlapping region $A_{cross}$ of the visual region A(1) and the visual region A(2) of the pixel island 110. The pupil 410 of the left eye is located in the visual sub-region $A_{sub}(5)$ of the pixel island 110. The visual sub-region $A_{sub}(5)$ is determined as the first visual sub-region of the pixel island, and the sub-pixel $P_{sub}(5)$ corresponding to the visual sub-region $A_{sub}(5)$ is determined as the first sub-pixel of the pixel island. It is determined that the third candidate visual sub-region is the visual sub-region $A_{sub}(8)$ of the visual region A(1). It is determined that the fourth candidate visual sub-region includes the visual sub-region $A_{sub}(1)$ and the visual sub-region $A_{sub}(2)$ of the visual region A(2). By comparing the distance between the third candidate visual sub-region and the first visual sub-region and the distance between the fourth candidate visual sub-region and the first visual sub-region, it can be found that the distance between the visual sub-region $A_{sub}(8)$ of the visual region A(1) and the first visual sub-region is larger, and thus it is determined that the visual sub-region $A_{sub}(8)$ of the visual region A(1) is the second visual sub-region of the pixel island. The sub-pixel $P_{sub}(8)$ corresponding to the visual sub-region $A_{sub}(8)$ is determined as the second sub-pixel of the pixel island.

Figure 41:
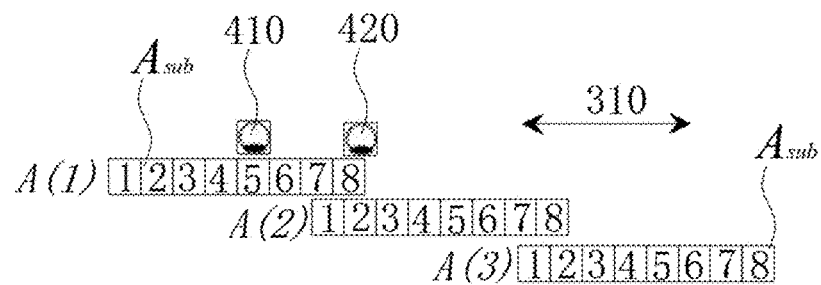
FIG. 41 is a schematic diagram showing a relationship between the pupils of the eyes and visual sub-regions when the eyes are within the dotted line frame E in FIG. 36 in an embodiment.

For another example, referring to FIG. 41, the pupil 420 of the right eye is located in the overlapping region $A_{cross}$ of the visual region A(1) and the visual region A(2) of the pixel island 110. The pupil 410 of the left eye is located in the visual sub-region $A_{sub}(5)$ of the pixel island 110. It is determined that the visual sub-region $A_{sub}(5)$ is the first visual sub-region of the pixel island, and the sub-pixel $P_{sub}(5)$ corresponding to the visual sub-region $A_{sub}(5)$ is the first sub-pixel of the pixel island. It is determined that the third candidate visual sub-region is the visual sub-region $A_{sub}(8)$ of the visual region A(1). It is determined that the fourth candidate visual sub-region is the visual sub-region $A_{sub}(2)$ of the visual region A(2). By comparing the distance between the third candidate visual sub-region and the first visual sub-region and the distance between the fourth candidate visual sub-region and the first visual sub-region, it can be found that the distance between the visual sub-region $A_{sub}(2)$ of the visual region A(2) and the first visual sub-region is larger, and thus the visual sub-region $A_{sub}(2)$ of the visual region A(2) is determined as the second visual sub-region of the pixel island. The sub-pixel $P_{sub}(2)$ corresponding to the visual sub-region $A_{sub}(2)$ is determined as the second sub-pixel of the pixel island.

It should be noted that although the various steps of the methods of embodiments of the present disclosure are described in the specification in a specific order, this does not require or imply that the steps must be performed in the specific order, or that all of the steps shown must be performed to achieve desired result. Additionally or alternatively, certain steps may be omitted, multiple steps may be combined into one step, and/or one step may be decomposed into multiple steps, etc., all of such modifications should be considered as part of the present disclosure.

An embodiment of the present disclosure provides a driving method of a display device, so that the display device can realize 2D display. The display device includes any one of the assemblies described in the above display assembly embodiments, and the pitch $P_{lens}$ of the lenticular lenses 210 is equal to the size $D_{pixel}$ of the opening 111 of each pixel island in the set direction 310. The driving method of the display device may include the following steps:

driving sub-pixels of the pixel islands to display 2D images.

It should be understood that the present disclosure does not limit its application to the detailed structures and arrangements of components set forth in this specification. The present disclosure can be embodied in other manners and can be implemented and carried out in various ways. The variations and modifications fall within the scope of the present disclosure. It will be understood that the contents disclosed and defined in this specification extend to all alternative combinations of two or more of individual features mentioned or evident in the text and/or drawings. All of these different combinations constitute various alternative aspects of the present disclosure. Embodiments in this specification illustrate the best mode for carrying out the disclosure, and will enable those skilled in the art to utilize the present disclosure.

What is claimed is:

1. A display assembly, comprising: a display panel provided with a plurality of pixel islands distributed in an array, wherein any one of the pixel islands comprises a plurality of sub-pixels continuously arranged along a set direction; and a lens layer arranged on a light exit surface of the display panel and comprising a plurality of lenticular lenses arranged along the set direction; wherein a lenticular lens pitch is not greater than a size of an opening of each of the pixel islands in the set direction, and along the set direction, a sub-pixel pitch in each of the pixel islands is smaller than a half of the lenticular lens pitch; wherein the lenticular lens pitch is equal to a sum of a size of each of the lenticular lenses in the set direction and a distance between two adjacent ones of the plurality of lenticular lenses; wherein a driving method for driving a display device comprises: obtaining positions of both eyes; determining image sub-pixels of the pixel islands according to the positions of both eyes, wherein an image sub-pixel of any one of the pixel islands comprises a first sub-pixel for displaying a left-eye image and a second sub-pixel for displaying a right-eye image; and driving first sub-pixels to display left-eye images, and driving second sub-pixels to display right-eye images; wherein determining image sub-pixels of the pixel islands according to the positions of both eyes comprises: determining the first sub-pixel and the second sub-pixel of each of the pixel islands according to the positions of both eyes; wherein determining of the first sub-pixel and the second sub-pixel of any one of the pixel islands comprises: determining from visual sub-regions of the pixel island a visual sub-region where the pupil of the left eye is located as a first visual sub-region; determining a sub-pixel corresponding to the first visual sub-region as the first sub- pixel of the pixel island; determining from the visual sub-regions of the pixel island a visual sub-region where the pupil of the right eye is located as a second visual sub-region; and determining a sub-pixel corresponding to the second visual sub-region as the second sub-pixel of the pixel island; wherein any one of the visual sub-regions of the pixel island is a spatial region projected by one of the sub-pixels of the pixel island through one of the lenticular lenses.

2. The display assembly according to claim 1, wherein the pixel islands are located at a focal plane of the lenticular lenses.

3. The display assembly according to claim 1, wherein the opening of each of the pixel islands is shaped as a parallelogram, and a short side direction of the opening of each of the pixel islands is parallel to an extending direction of each of the lenticular lens.

4. The display assembly according to claim 1, wherein a size of the opening of each of the pixel islands in the set direction is equal to 10 to 100 microns.

5. The display assembly according to claim 1, wherein a size of each of the lenticular lenses in the set direction is equal to the lenticular lens pitch.

6. The display assembly according to claim 1, wherein the lens layer further comprises a plurality of light shielding bars arranged along the set direction, and the light shielding bars and the lenticular lenses are alternately arranged.

7. The display assembly according to claim 1, wherein light emitting colors of sub-pixels in a same pixel island are the same.

8. The display assembly according to claim 1, wherein there are four to twelve sub-pixels continuously arranged along the set direction in any one of the pixel islands.

9. The display assembly according to claim 1, wherein a focal length of each of the lenticular lenses is equal to 62 to 82 microns, the lenticular lens pitch is equal to 30 to 40 microns, and the size of the opening of each of the pixel islands in the set direction is equal to 30 to 40 microns.

10. The display assembly according to claim 1, wherein a focal length of each of the lenticular lenses is equal to 300 to 400 microns, the lenticular lens pitch is equal to 75 to 100 microns, and the size of the opening of each of the pixel islands in the set direction is equal to 75 to 100 microns.

11. The display assembly according to claim 1, wherein the lenticular lens pitch is equal to the size of the opening of each of the pixel islands in the set direction.

12. A display device comprising a display assembly; wherein the display assembly comprises: a display panel provided with a plurality of pixel islands distributed in an array, wherein any one of the pixel islands comprises a plurality of sub-pixels continuously arranged along a set direction; and a lens layer arranged on a light exit surface of the display panel and comprising a plurality of lenticular lenses arranged along the set direction; wherein a lenticular lens pitch is not greater than a size of an opening of each of the pixel islands in the set direction, and along the set direction, a sub-pixel pitch in each of the pixel islands is smaller than a half of the lenticular lens pitch; wherein the lenticular lens pitch is equal to a sum of a size of each of the lenticular lenses in the set direction and a distance between two adjacent ones of the plurality of lenticular lenses; wherein a driving method for driving a display device comprises: obtaining positions of both eyes; determining image sub-pixels of the pixel islands according to the positions of both eyes, wherein an image sub-pixel of any one of the pixel islands comprises a first sub-pixel for displaying a left-eye image and a second sub-pixel for displaying a right-eye image; and driving first sub-pixels to display left-eye images, and driving second sub-pixels to display right-eye images; wherein determining image sub-pixels of the pixel islands according to the positions of both eyes comprises: determining the first sub-pixel and the second sub-pixel of each of the pixel islands according to the positions of both eyes; wherein determining of the first sub-pixel and the second sub-pixel of any one of the pixel islands comprises: determining from visual sub-regions of the pixel island a visual sub-region where the pupil of the left eye is located as a first visual sub-region; determining a sub-pixel corresponding to the first visual sub-region as the first sub-pixel of the pixel island; determining from the visual sub-regions of the pixel island a visual sub-region where the pupil of the right eye is located as a second visual sub-region; and determining a sub-pixel corresponding to the second visual sub-region as the second sub-pixel of the pixel island; wherein any one of the visual sub-regions of the pixel island is a spatial region projected by one of the sub-pixels of the pixel island through one of the lenticular lenses.

13. The display device according to claim 12, wherein the pixel islands are located at a focal plane of the lenticular lenses.

14. The display device according to claim 12, wherein the opening of each of the pixel islands is shaped as a parallelogram, and a short side direction of the opening of each of the pixel islands is parallel to an extending direction of each of the lenticular lens.

15. The display device according to claim 12, wherein a size of the opening of each of the pixel islands in the set direction is equal to 10 to 100 microns.

16. The display device according to claim 12, wherein a size of each of the lenticular lenses in the set direction is equal to the lenticular lens pitch.

17. The display device according to claim 12, wherein the lens layer further comprises a plurality of light shielding bars arranged along the set direction, and the light shielding bars and the lenticular lenses are alternately arranged.

18. A driving method for driving a display device, wherein the display device comprises a display assembly; wherein the display assembly comprises: a display panel provided with a plurality of pixel islands distributed in an array, wherein any one of the pixel islands comprises a plurality of sub-pixels continuously arranged along a set direction; and a lens layer arranged on a light exit surface of the display panel and comprising a plurality of lenticular lenses arranged along the set direction; wherein a lenticular lens pitch is not greater than a size of an opening of each of the pixel islands in the set direction, and along the set direction, a sub-pixel pitch in each of the pixel islands is smaller than a half of the lenticular lens pitch; wherein the lenticular lens pitch is equal to a sum of a size of each of the lenticular lenses in the set direction and a distance between two adjacent ones of the plurality of lenticular lenses; wherein the driving method comprises: obtaining positions of both eyes; determining image sub-pixels of the pixel islands according to the positions of both eyes, wherein an image sub-pixel of any one of the pixel islands comprises a first sub-pixel for displaying a left-eye image and a second sub-pixel for displaying a right-eye image; and driving first sub-pixels to display left-eye images, and driving second sub-pixels to display right-eye images; wherein determining image sub-pixels of the pixel islands according to the positions of both eyes comprises: determining the first sub-pixel and the second sub-pixel of each of the pixel islands according to the positions of both eyes; wherein determining of the first sub-pixel and the second sub-pixel of any one of the pixel islands comprises: determining from visual sub-regions of the pixel island a visual sub-region where the pupil of the left eye is located as a first visual sub-region; determining a sub-pixel corresponding to the first visual sub-region as the first sub- pixel of the pixel island; determining from the visual sub-regions of the pixel island a visual sub-region where the pupil of the right eye is located as a second visual sub-region; and determining a sub-pixel corresponding to the second visual sub-region as the second sub-pixel of the pixel island; wherein any one of the visual sub-regions of the pixel island is a spatial region projected by one of the sub-pixels of the pixel island through one of the lenticular lenses.

19. The driving method for the display device according to claim 18, wherein the lenticular lens pitch is equal to the size of the opening of each of the pixel islands in the set direction.

20. The driving method for the display device according to claim 18, wherein the lenticular lens pitch is smaller than the size of the opening of each of the pixel islands in the set direction;
   wherein determining image sub-pixels of the pixel islands according to the positions of both eyes comprises:
   determining the first sub-pixel and the second sub-pixel of each of the pixel islands according to the positions of both eyes;
   wherein determining of the first sub-pixel and the second sub-pixel of any one of the pixel islands comprises:
      determining whether any one of the pupil of the left eye and the pupil of the right eye is located in an overlapping region of different visual regions of the pixel island;
      if neither the pupil of the left eye nor the pupil of the right eye is located in the overlapping region of the different visual regions of the pixel island, determining from visual sub-regions of the pixel island a visual sub-region where the pupil of the left eye is located as a first visual sub-region; determining a sub-pixel corresponding to the first visual sub-region as the first sub-pixel of the pixel island; determining from the visual sub-regions of the pixel island a visual sub-region where the pupil of the right eye is located as a second visual sub-region; and determining a sub-pixel corresponding to the second visual sub-region as the second sub-pixel of the pixel island;
   if the pupil of the left eye is located in the overlapping region of the different visual regions of the pixel island, determining from the visual sub-regions of the pixel island a visual sub-region where the pupil of the right eye is located as a second visual sub-region; determining a sub-pixel corresponding to the second visual sub-region as the second sub-pixel of the pixel island; determining from the visual sub-regions of the pixel island a visual sub-region where the pupil of the left eye is located and which belongs to one of the visual regions as a first candidate visual sub-region; determining from the visual sub-regions of the pixel island a visual sub-region where the pupil of the left eye is located and which belongs to another one of the visual regions as a second candidate visual sub-region; on a connection line connecting the pupil of the left eye and the pupil of the right eye, selecting one of the first candidate visual sub-region and the second candidate visual sub-region which has a larger distance from the second visual sub-region as the first visual sub-region; and determining a sub-pixel corresponding to the first visual sub-region as the first sub-pixel of the pixel island; and if the pupil of the right eye is located in the overlapping region of the different visual regions of the pixel island, determining from the visual sub-regions of the pixel island a visual sub-region where the pupil of the left eye is located as a first visual sub-region; determining a sub-pixel corresponding to the first visual sub-region as the first sub-pixel of the pixel island; determining from the visual sub-regions of the pixel island a visual sub-region where the pupil of the right eye is located and which belongs to one of the visual regions as a third candidate visual sub-region; determining from the visual sub-regions of the pixel island a visual sub-region where the pupil of the right eye is located and which belongs to another one of the visual regions as a fourth candidate visual sub-region; on a connection line connecting the pupil of the left eye and the pupil of the right eye, selecting one of the third candidate visual sub-region and the fourth candidate visual sub-region which has a larger distance from the first visual sub-region as the second visual sub-region; and determining a sub-pixel corresponding to the second visual sub-region as the second sub-pixel of the pixel island;

wherein any one of the visual regions of the pixel island is a spatial region projected by the pixel island through one of the lenticular lenses, and any one of the visual sub-regions of the pixel island is a spatial region projected by one of the sub-pixels of the pixel island through one of the lenticular lenses.

* * * * *